(12) United States Patent
Yang

(10) Patent No.: US 10,726,929 B1
(45) Date of Patent: Jul. 28, 2020

(54) PROGRAMMING PROCESS WHICH COMPENSATES FOR DATA STATE OF ADJACENT MEMORY CELL IN A MEMORY DEVICE

(71) Applicant: SanDisk Technologies LLC, Addison, TX (US)

(72) Inventor: Xiang Yang, Santa Clara, CA (US)

(73) Assignee: SanDisk Technologies LLC, Addison, TX (US)

( * ) Notice: Subject to any disclaimer, the term of this patent is extended or adjusted under 35 U.S.C. 154(b) by 0 days.

(21) Appl. No.: 16/257,074

(22) Filed: Jan. 25, 2019

(51) Int. Cl.
| | | |
|---|---|---|
| G11C 16/34 | (2006.01) | |
| G11C 11/56 | (2006.01) | |
| G11C 7/10 | (2006.01) | |
| G11C 16/26 | (2006.01) | |
| G11C 16/08 | (2006.01) | |
| G11C 16/16 | (2006.01) | |
| G11C 16/24 | (2006.01) | |

(52) U.S. Cl.
CPC .......... *G11C 16/3427* (2013.01); *G11C 7/106* (2013.01); *G11C 11/5628* (2013.01); *G11C 11/5642* (2013.01); *G11C 16/08* (2013.01); *G11C 16/16* (2013.01); *G11C 16/24* (2013.01); *G11C 16/26* (2013.01); *G11C 16/3404* (2013.01); *G11C 16/3459* (2013.01)

(58) Field of Classification Search
CPC ..... G11C 16/3427; G11C 16/26; G11C 16/08; G11C 16/16; G11C 16/3404; G11C 16/3459; G11C 11/5642; G11C 7/106; G11C 11/5628; G11C 16/24

See application file for complete search history.

(56) References Cited

U.S. PATENT DOCUMENTS

| | | |
|---|---|---|
| 6,608,499 B2 | 8/2003 | Liu et al. |
| 7,606,084 B2 | 10/2009 | Kamei |
| 7,616,505 B2 | 11/2009 | Mui et al. |
| 7,652,929 B2 | 1/2010 | Li |
| 7,876,611 B2 | 1/2011 | Dutta et al. |
| 8,274,838 B2 | 9/2012 | Dutta et al. |
| 8,665,647 B2 | 3/2014 | Lee et al. |
| 9,336,891 B2 | 5/2016 | Yuan et al. |
| 9,805,809 B1 | 10/2017 | Zhou et al. |
| 9,922,719 B2 | 3/2018 | Li et al. |
| 2011/0032757 A1 | 2/2011 | Dutta et al. |

(Continued)

*Primary Examiner* — Ajay Ojha
(74) *Attorney, Agent, or Firm* — Vierra Magen Marcus LLP

(57) ABSTRACT

Techniques are provided to compensate for neighbor word line interference when programming memory cells connected to a selected word line WLn. Before programming, the assigned data states of WLn and WLn+1 are compared and corresponding compensation data is generated. The compensation data may be stored in latches of sense circuits to modify the verify tests which occur during programming. The compensation can involve adjusting the bit line voltage, word line voltage, sense node discharge period and/or trip voltage. During a verify test, the compensation data can cause a WLn memory cell to complete programming when its threshold voltage is lower than would be the case with no compensation. When the WLn+1 memory cells are subsequently programmed, an upshift in the threshold voltage of the WLn memory cell offsets the compensation.

18 Claims, 21 Drawing Sheets

(56) References Cited

U.S. PATENT DOCUMENTS

| | | | |
|---|---|---|---|
| 2015/0301885 A1 | 10/2015 | Yuan et al. | |
| 2016/0005491 A1* | 1/2016 | Yuan | G11C 11/5642 365/185.02 |
| 2018/0308556 A1 | 10/2018 | Baraskar et al. | |

* cited by examiner

Fig. 5A
Fig. 5B
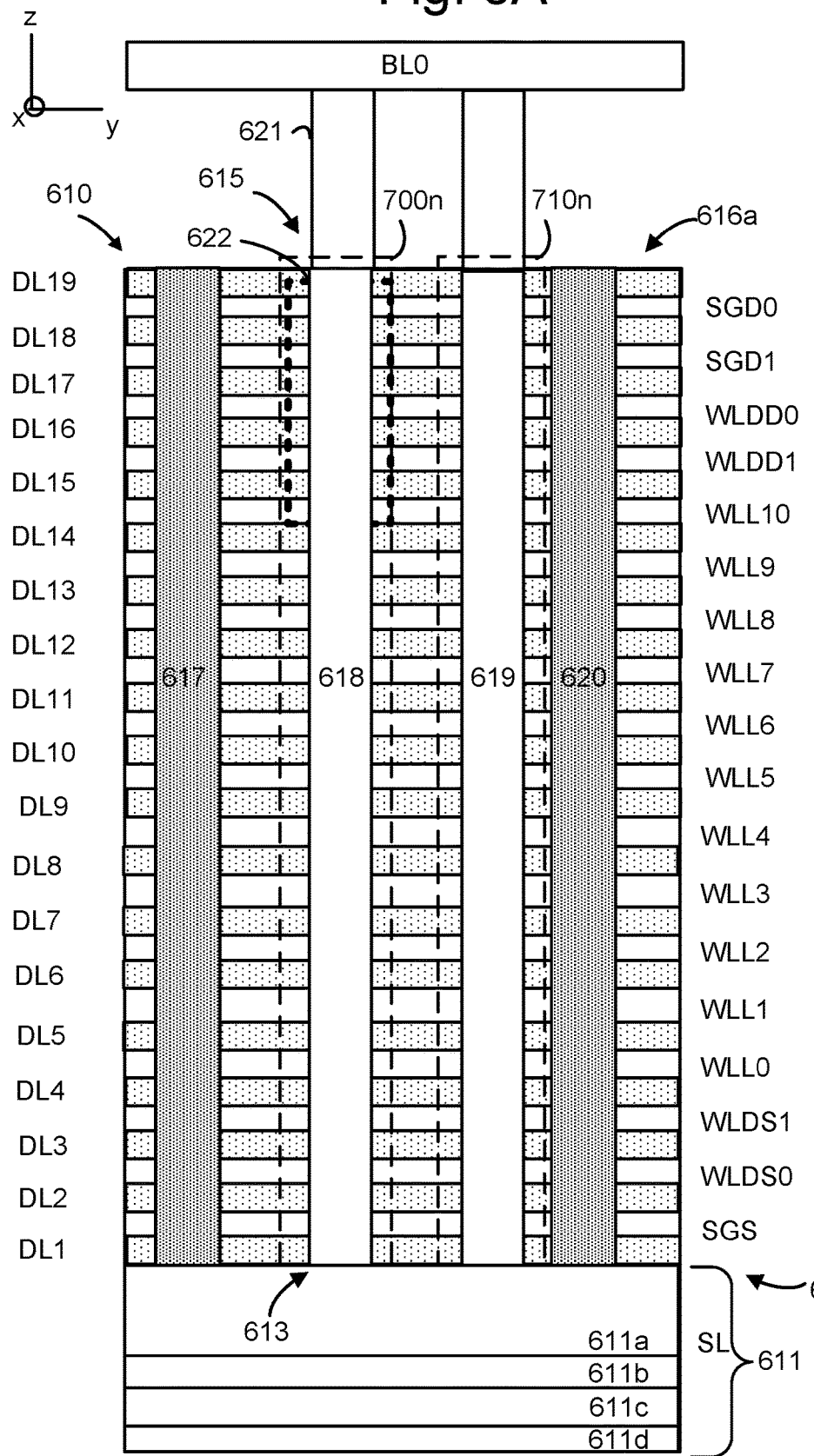
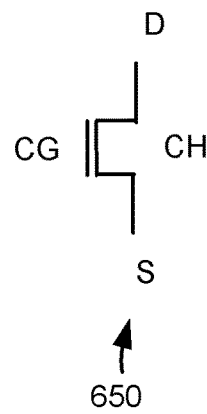

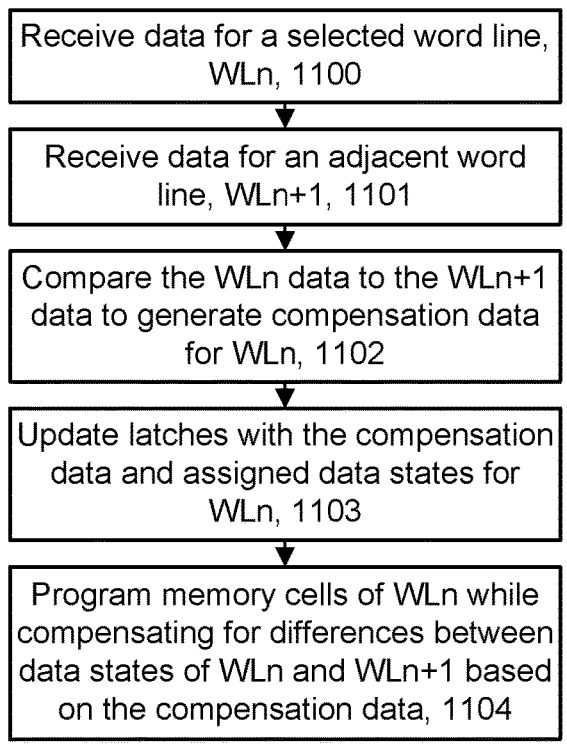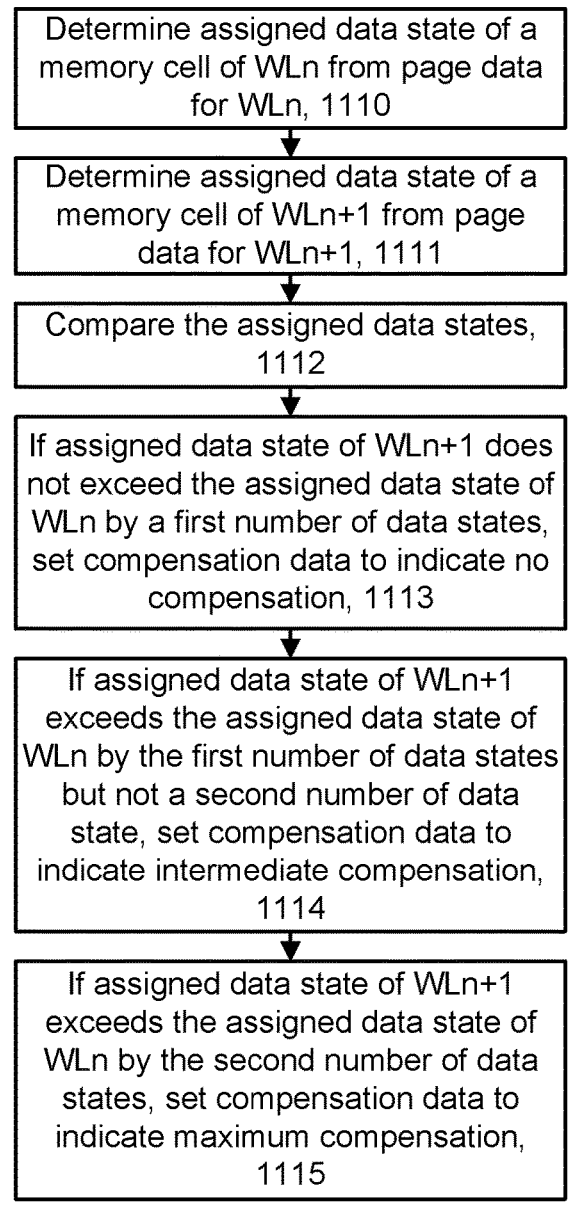

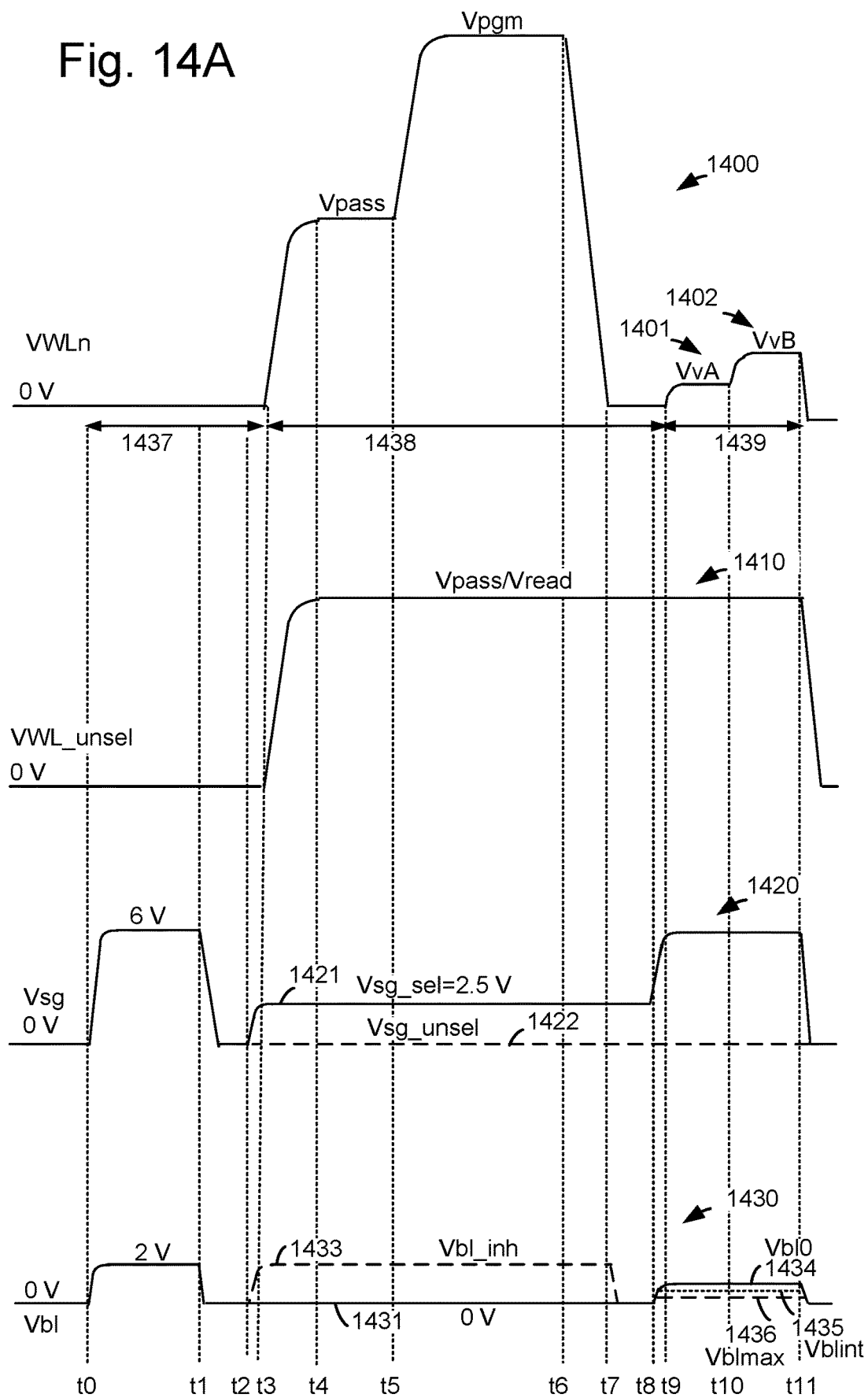

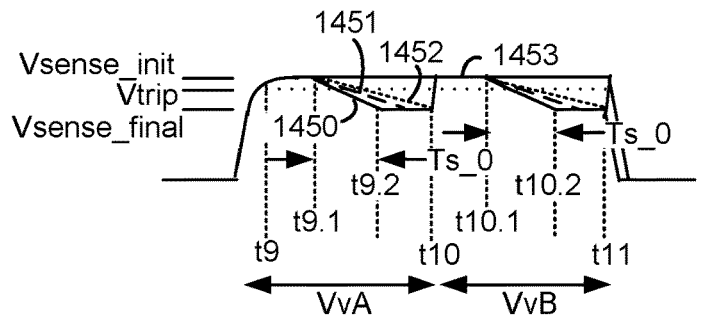
Fig. 14B
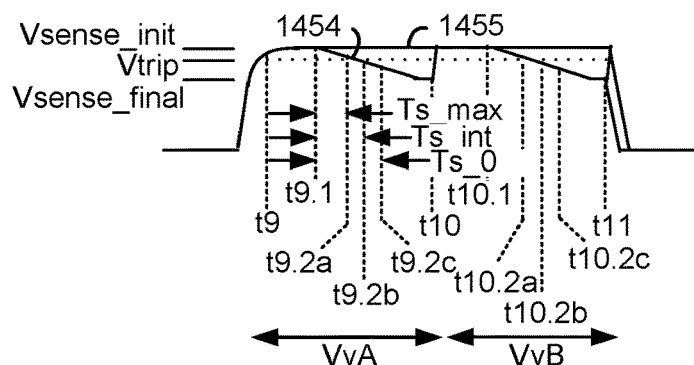
Fig. 14C
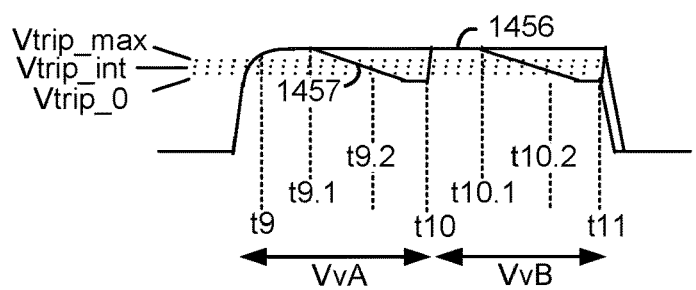
Fig. 14D
Fig. 14E
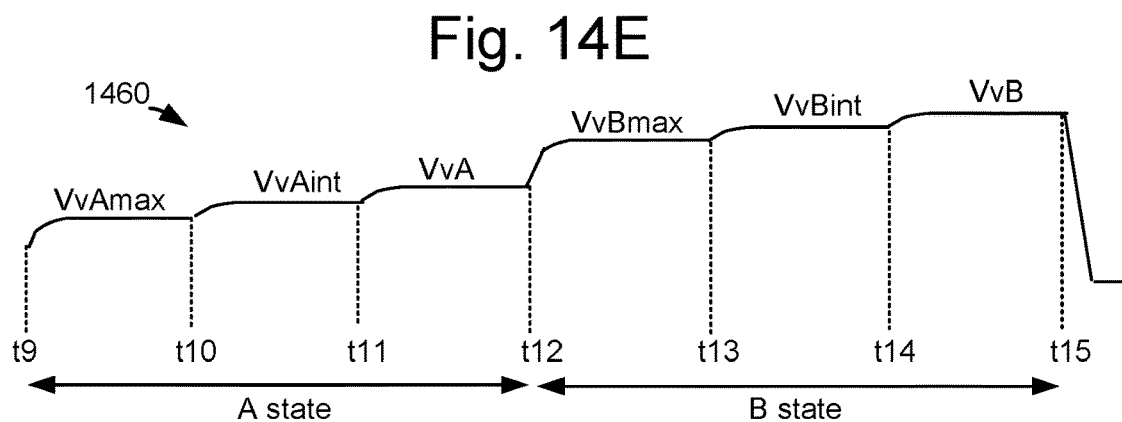

Fig. 15A

WLn+1 state

| WLn state | Er | A | B | C | D | E | F | G |
|---|---|---|---|---|---|---|---|---|
| A | 0 | 0 | 0 | 0 | 0 | max | max | max |
| B | 0 | 0 | 0 | 0 | 0 | 0 | max | max |
| C | 0 | 0 | 0 | 0 | 0 | 0 | 0 | max |
| D-G | 0 | 0 | 0 | 0 | 0 | 0 | 0 | 0 |

Fig. 15B

WLn+1 state

| WLn state | Er | A | B | C | D | E | F | G |
|---|---|---|---|---|---|---|---|---|
| A | 0 | 0 | 0 | 0 | 0 | int | int | max |
| B | 0 | 0 | 0 | 0 | 0 | 0 | int | int |
| C | 0 | 0 | 0 | 0 | 0 | 0 | 0 | int |
| D | 0 | 0 | 0 | 0 | 0 | 0 | 0 | int |
| E-G | 0 | 0 | 0 | 0 | 0 | 0 | 0 | 0 |

Fig. 15C

WLn+1 state

| WLn state | Er | A | B | C | D | E | F | G |
|---|---|---|---|---|---|---|---|---|
| A | 0 | 0 | 0 | 0 | int | int | int | max |
| B | 0 | 0 | 0 | 0 | 0 | int | int | int |
| C | 0 | 0 | 0 | 0 | 0 | 0 | int | int |
| D | 0 | 0 | 0 | 0 | 0 | 0 | 0 | int |
| E-G | 0 | 0 | 0 | 0 | 0 | 0 | 0 | 0 |

Fig. 15D

WLn+1 state

| WLn state | Er | A | B | C | D | E | F | G |
|---|---|---|---|---|---|---|---|---|
| A | 0 | 0 | 0 | 0 | intL | intH | intH | max |
| B | 0 | 0 | 0 | 0 | 0 | intL | intH | intH |
| C | 0 | 0 | 0 | 0 | 0 | 0 | intL | intH |
| D | 0 | 0 | 0 | 0 | 0 | 0 | 0 | intL |
| E | 0 | 0 | 0 | 0 | 0 | 0 | 0 | intL |
| F, G | 0 | 0 | 0 | 0 | 0 | 0 | 0 | 0 |

Fig. 15E

| Latch: | Er | A | B | C | D | E | F | G |
|---|---|---|---|---|---|---|---|---|
| UDL | 1 | 0 | 0 | 1 | 1 | 0 | 0 | 1 |
| MDL | 1 | 1 | 0 | 0 | 0 | 0 | 1 | 1 |
| LDL | 1 | 1 | 1 | 1 | 0 | 0 | 0 | 0 |

Fig. 17

| Latch: | No comp. | max |
|---|---|---|
| CDL1 | 0 | 1 |

Fig. 18A

| Latch: | No comp. | int | max |
|---|---|---|---|
| CDL1 | 0 | 0 | 1 |
| CDL2 | 0 | 1 | 1 |

Fig. 18B

| Latch: | No comp. | intL | intH | max |
|---|---|---|---|---|
| CDL1 | 0 | 0 | 1 | 1 |
| CDL2 | 0 | 1 | 0 | 1 |

| WLn | G | C | E | F | A | Er | B | D |
|---|---|---|---|---|---|---|---|---|

Fig. 19A

| UP | 1 | 1 | 0 | 0 | 0 | 1 | 0 | 1 |
|---|---|---|---|---|---|---|---|---|
| MP | 1 | 0 | 0 | 1 | 1 | 1 | 0 | 0 |
| LP | 0 | 1 | 0 | 0 | 1 | 1 | 1 | 0 |

| WLn+1 | E | B | Er | D | G | C | F | A |
|---|---|---|---|---|---|---|---|---|

Fig. 19C

| UP | 0 | 0 | 1 | 1 | 1 | 1 | 0 | 0 |
|---|---|---|---|---|---|---|---|---|
| MP | 0 | 0 | 1 | 0 | 1 | 0 | 1 | 1 |
| LP | 0 | 1 | 1 | 0 | 0 | 1 | 0 | 1 |

Fig. 19D comp data per fig. 15b

| CDL2 | 0 | 0 | 0 | 0 | 1 | 0 | 0 | 0 |
|---|---|---|---|---|---|---|---|---|
| CDL1 | 0 | 0 | 0 | 0 | 1 | 0 | 1 | 0 | max       int

PROGRAMMING PROCESS WHICH COMPENSATES FOR DATA STATE OF ADJACENT MEMORY CELL IN A MEMORY DEVICE

BACKGROUND

The present technology relates to the operation of memory devices.

Semiconductor memory devices have become more popular for use in various electronic devices. For example, non-volatile semiconductor memory is used in cellular telephones, digital cameras, personal digital assistants, mobile computing devices, non-mobile computing devices and other devices.

A charge-storing material such as a floating gate or a charge-trapping material can be used in such memory devices to store a charge which represents a data state. A charge-trapping material can be arranged vertically in a three-dimensional (3D) stacked memory structure, or horizontally in a two-dimensional (2D) memory structure. One example of a 3D memory structure is the Bit Cost Scalable (BiCS) architecture which comprises a stack of alternating conductive and dielectric layers.

A memory device includes memory cells which may be arranged in series, in NAND strings (e.g., NAND chains), for instance. However, various challenges are presented in operating such memory devices.

BRIEF DESCRIPTION OF THE DRAWINGS

FIG. 5A depicts an example cross-sectional view of a portion of the block BLK0 of FIG. 4.

FIG. 5B depicts an example transistor 650 in BLK0.

FIG. 11A depicts a flowchart of an example process for programming memory cells of a word line WLn using compensation data.

FIG. 11B depicts a flowchart of an example process for generating the compensation data of step 1102 of FIG. 11A.

FIG. 14A depicts examples of voltage signals which can be used in a program-verify iteration of a program operation, consistent with FIG. 12.

FIG. 14B depicts example voltages of the sense node 171 of FIG. 2 during verify operations consistent with the verify phase of FIG. 14A and with step 1309 of FIG. 13, where three different bit line voltages are used.

FIG. 14C depicts example voltages of the sense node 171 of FIG. 2 during verify operations consistent with the verify phase of FIG. 14A and with step 1310 of FIG. 13, where three different sense node discharge durations are used.

FIG. 14D depicts example voltages of the sense node 171 of FIG. 2 during verify operations consistent with the verify phase of FIG. 14A and with step 1310 of FIG. 13, where three different trip voltages are used.

FIG. 14E depicts another example of VWLn during verify operations in the verify phase of FIG. 14A, consistent with step 1308 of FIG. 13, where three verify voltages are used for each data state.

FIG. 15A depicts an example of compensation data, where eight data states and two levels of compensation are provided.

FIG. 15B depicts an example of compensation data, where eight data states and three levels of compensation are provided.

FIG. 15C depicts another example of compensation data, where eight data states and three levels of compensation are provided, and where the level of compensation is a function of the assigned data state of the WLn memory cell.

FIG. 15D depicts an example of compensation data, where eight data states and four levels of compensation are provided.

FIG. 15E depicts an example of compensation data, where sixteen data states and four levels of compensation are provided.

FIG. 17 depicts example values in the data state latches of FIG. 2 during a program operation, where eight data states are used, consistent with step 1301 of FIG. 13.

FIG. 18A depicts example values in the compensation data latches CDL1 of FIG. 2 during a program operation, where two levels of compensation are provided, consistent with FIG. 15A.

FIG. 18B depicts example values in the compensation data latches CDL1 and CDL2 of FIG. 2 during a program operation, where three levels of compensation are provided, consistent with FIG. 15B.

FIG. 18C depicts example values in the compensation data latches CDL1 and CDL2 of FIG. 2 during a program operation, where four levels of compensation are provided, consistent with FIG. 15D.

FIG. 19A depicts an example set of memory cells connected to a word line WLn selected for programming, and their assigned data states, consistent with step 1100 of FIG. 11B.

FIG. 19B depicts example pages of data which represent the assigned data states of the set of memory cells of FIG. 19A, consistent with step 1100 of FIG. 11B and with FIG. 17.

FIG. 19C depicts an example set of memory cells connected to a word line WLn+1, and their assigned data states, consistent with step 1111 of FIG. 11B.

FIG. 19D depicts example pages of data which represent the assigned data states of the set of memory cells of FIG. 19C, consistent with step 1111 of FIG. 11B and with FIG. 17.

FIG. 19E depicts example compensation data which is generated from the pages of data of FIGS. 19B and 19D, consistent with steps 1113-1115 of FIG. 11B and with FIGS. 15B and 18B.

DETAILED DESCRIPTION

Apparatuses and techniques are described for optimizing a program operation in a memory device, where the program operation for a selected word line is modified based on the assigned data states of memory cells on an adjacent, later-programmed word line.

In some memory devices, memory cells are joined to one another such as in NAND strings in a block or sub-block. Each NAND string comprises a number of memory cells connected in series between one or more drain-end select gate transistors (referred to as SGD transistors), on a drain-end of the NAND string which is connected to a bit line, and one or more source-end select gate transistors (referred to as SGS transistors), on a source-end of the NAND string or other memory string or set of connected memory cells which is connected to a source line. Further, the memory cells can be arranged with a common control gate line (e.g., word line) which acts a control gate. A set of word lines extends from the source side of a block to the drain side of a block. Memory cells can be connected in other types of strings and in other ways as well.

Figure 6:
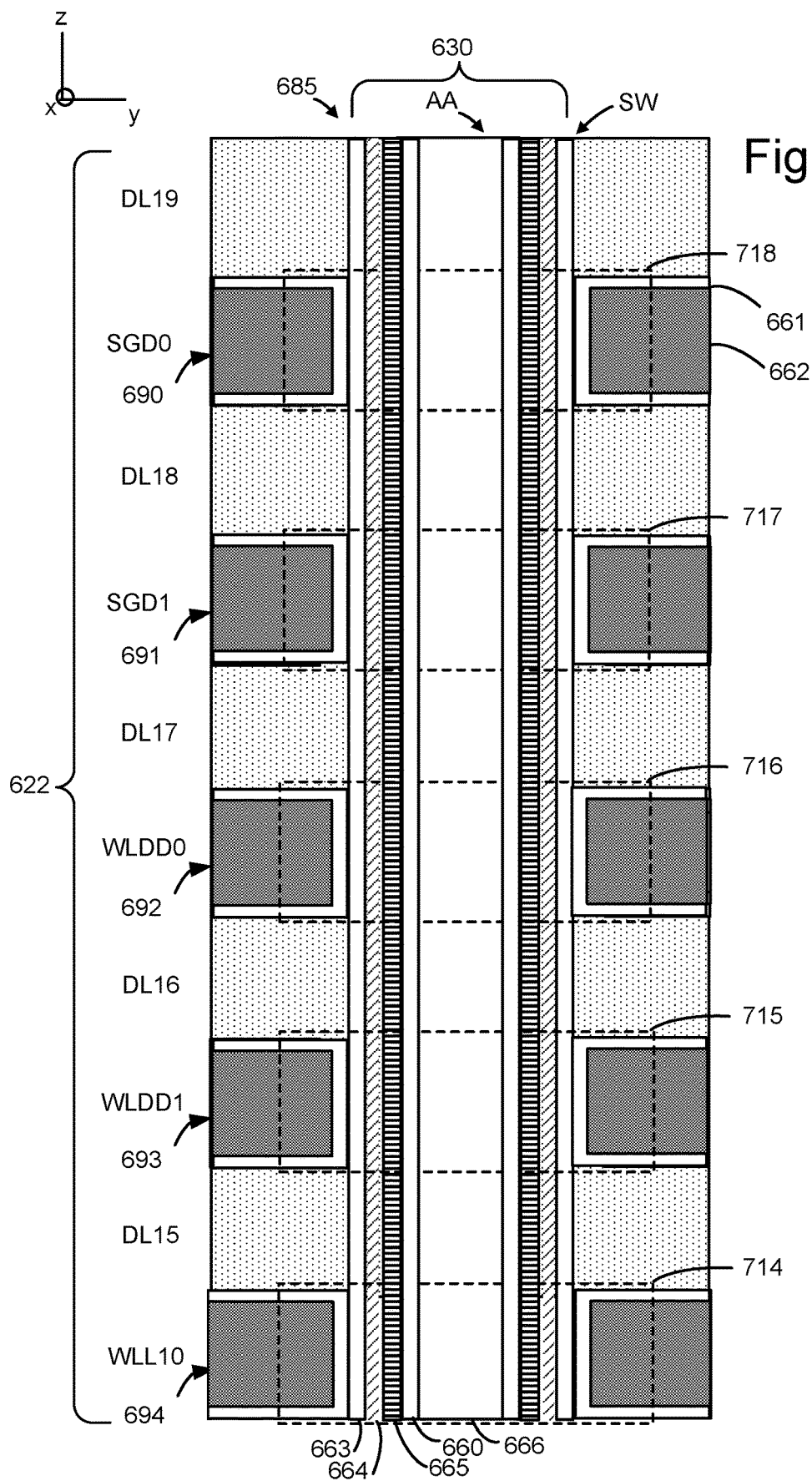
FIG. 6 depicts a close-up view of the region 622 of the stack of FIG. 5A.

In a 3D memory structure, the memory cells may be arranged in vertical NAND strings in a stack, where the stack comprises alternating conductive and dielectric layers. The conductive layers act as word lines which are connected to the memory cells. Each NAND string may have the shape of a pillar which intersects with the word lines to form the memory cells. To form a NAND string, a memory hole is formed in the stack and various layers are deposited on the sidewall of the memory hole, including a blocking oxide layer 663, a charge-trapping layer 664, a tunneling layer 665 and a channel layer 660, such as depicted in FIG. 6.

The memory cells can include data memory cells, which are eligible to store user data, and dummy or non-data memory cells which are ineligible to store user data. A dummy memory cell may have the same construction as a data memory cell but is considered by the controller to be ineligible to store any type of data including user data. A dummy word line is connected to a dummy memory cell. One or more dummy memory cells may be provided at the drain and/or source ends of a string of memory cells to provide a gradual transition in the channel voltage gradient.

Figure 10A:
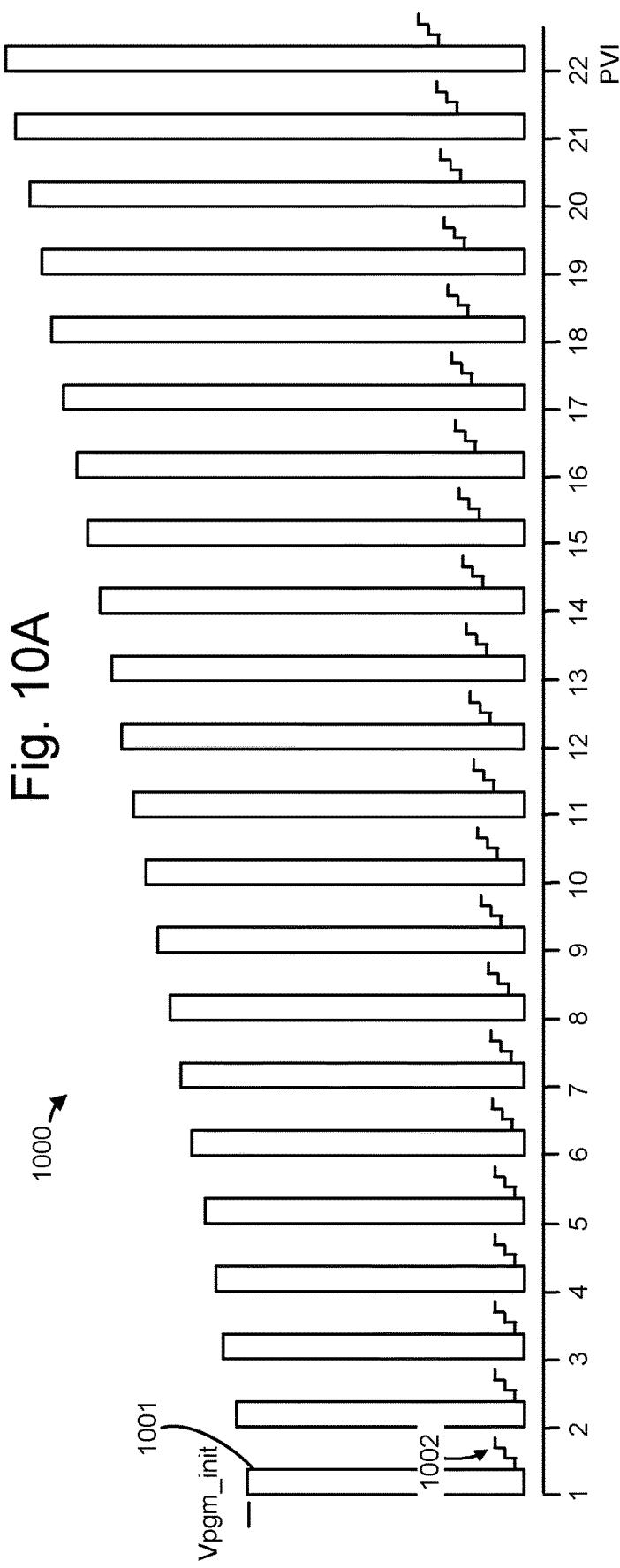
FIG. 10A depicts a voltage signal used in a series of program-verify iterations in an example program operation which results in the Vth distributions of FIG. 9A-9C.

During a programming operation, the memory cells are programmed according to a word line programming order. For example, the programming may start at the word line at the source side of the block and proceed to the word line at the drain side of the block. The word line which is currently selected for programming may be referred to as WLn. In one approach, each word line is completely programmed before programming a next word line. For example, a first word line, WL0, is programmed using one or more programming passes until the programming is completed. Next, a second word line, WL1, is programmed using one or more programming passes until the programming is completed, and so forth. A programming pass may include a set of increasing program voltages which are applied to the word line in respective program loops or program-verify iterations, such as depicted in FIG. 10A. In each program-verify iteration, verify operations may be performed after each program voltage to determine whether the memory cells have completed programming. When programming is completed for a memory cell, it can be locked out from further programming while programming continues for other memory cells in subsequent program-verify iterations.

The memory cells may also be programmed according to a sub-block programming order, where memory cells connected to a word line are programmed in one sub-block, then a next sub-block and so forth.

During programming, charges are drawn into the charge trapping layer 664 from the channel. For example, when the memory cell 714 of FIG. 6 is programmed, charges are drawn into a portion of the trapping layer at the height of the word line WLL10.

Each memory cell may be associated with a data state according to write data in a program command. Based on its data state, a memory cell will either remain in the erased state or be programmed to a programmed data state (a data state higher than the erased state). MLC or multi-level cells store two or more bits per cell. For example, in a two-bit per cell memory device, there are four data states including the erased state and three higher data states referred to as the A, B and C data states. In a three-bit per cell memory device, there are eight data states including the erased state and seven higher data states referred to as the A, B, C, D, E, F and G data states (see FIG. 9A). In a four-bit per cell memory device, there are sixteen data states including the erased state and fifteen higher data states.

However, as the dimensions of memory devices become smaller, various types of disturbs can occur. For example, as the distance between word lines becomes smaller, neighbor word line interference (NWI) can occur. With NWI, a selected memory cell connected to a selected word line WLn (e.g., the memory cell 705 connected to WL1 in FIG. 7) can be disturbed when the adjacent memory cell (e.g., the memory cell 706 in FIG. 7) connected to the adjacent word line (e.g., WL2) is programmed. Both memory cells are in the same NAND string 700n. The disturb is strongest when the WLn memory cell is in a low programmed data state (e.g., the A state in FIG. 9A) and the WLn+1 memory cell is in a high programmed data state (e.g., the G state in FIG. 9A). Specifically, when the WLn+1 memory cell is programmed, parasitic charges are created in the charge trapping layer between WLn and WLn+1, causing the Vth of the WLn memory cell to appear to be upshifted. The disturb is greater when the amount by which the threshold voltage (Vth) or data state of the WLn+1 memory cell exceeds the Vth or data state, respectively, of the WLn memory cell, is greater.

As used herein, a threshold voltage upshift refers to a change in the threshold voltage such that the threshold voltage changes from a lower threshold voltage to a higher threshold voltage. Similarly, as used herein, a threshold voltage downshift refers to a change in the threshold voltage such that the threshold voltage changes from a higher threshold voltage to a lower threshold voltage.

Another type of disturb is lateral charge loss, in which charges from the WLn+1 memory cell move in the charge trapping layer 664 (FIG. 6) toward the WLn memory cell. This movement is due to data retention issues which become more severe as time passes after programming.

Techniques provided herein address the above and other issues. In one aspect, the assigned data states of the WLn and WLn+1 memory cells are analyzed before programming the WLn memory cells. For each WLn memory cell, compensation data is generated based on the assigned data state of the adjacent (same NAND string) WLn+1 memory cell. In a simplified approach, a single bit of compensation data indicates whether or not compensation should be applied to the WLn memory cell when it is programmed. In another approach, two bits of compensation data can indicate that no compensation should be applied, or one of three different compensation levels should be applied.

In some cases, no compensation is provided, such as when the data state of the WLn+1 memory cell is not more than a specified number of data states higher than the data state of the WLn memory cell. In other words, the data state of the WLn+1 memory cell has to be at least a specified number of data states higher than the data state of the WLn memory cell for compensation to be provided during the programming of the WLn memory cell.

The compensation can be provided in various forms. Generally, when a relatively large Vth upshift is expected for a WLn memory cell due to the later programming of the adjacent WLn+1 memory cell, the WLn memory cell is programmed to a relatively low Vth. The verify tests of the program operation can be configured to adjust the bias conditions of the WLn memory cell during sensing. In one example, a bit line voltage, which is the drain voltage of the WLn memory cell, is lowered below a level which is used for the case of no compensation. See FIGS. 14A and 14B. In one example, the word line voltage, which is the control gate voltage of the WLn memory cell, is lowered below a level which is used for the case of no compensation. See FIG. 14E. Multiple forms of compensation can be used together as well.

Another option is to adjust the source voltage of the selected memory cell by adjusting the source line voltage of the NAND string.

The verify tests of the program operation can also be configured to adjust the parameters of a sense circuit. For example, a sense node discharge duration can be shortened below a level which is used for the case of no compensation. See FIG. 14C. A trip voltage can also be increased above a level which is used for the case of no compensation. See FIG. 14D.

Generally, a sense circuit is configured to sense the selected memory cell during the verification signal and to set a parameter of the sensing as a function of a difference between an assigned data state of the selected memory cell and an assigned data state of the adjacent memory cell. The parameter can include, e.g., a bit line voltage, a word line voltage, a sense node discharge duration and/or a sense node trip voltage.

In another aspect, a controller receives, from a host, data which is to be programmed to a selected word line WL. If the data which is to be written to the adjacent word line WLn+1 is not yet received, the programming of the data to WLn is delayed until after the WLn+1 data is received. The programming of the data to WLn can also be delayed until after the compensation data for WLn is generated and stored in latches connected to the NAND strings.

These and other features are discussed further below.

Figure 1:
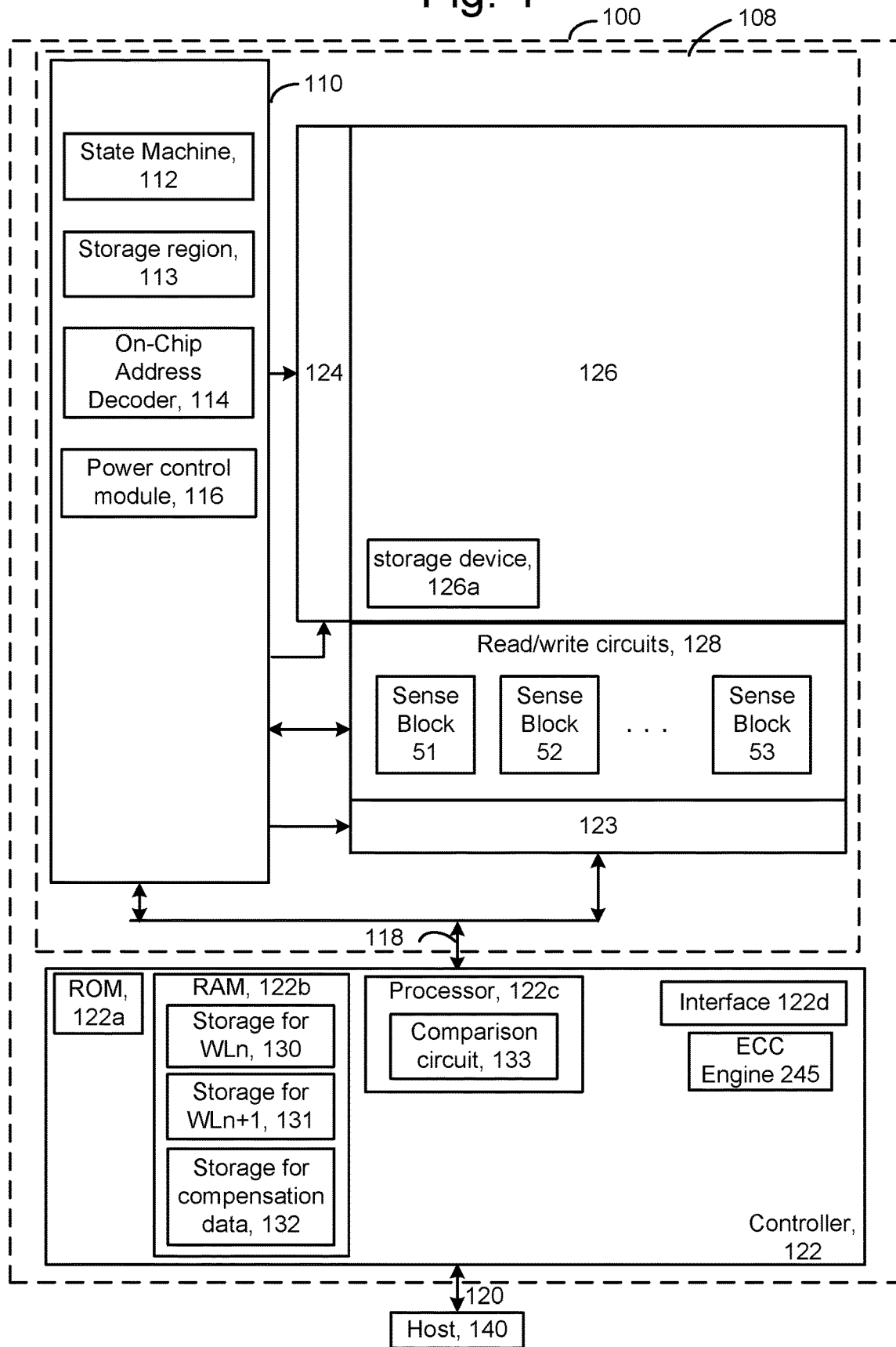
FIG. 1 is a block diagram of an example memory device.

FIG. 1 is a block diagram of an example memory device. The memory device 100, such as a non-volatile storage system, may include one or more memory die 108. The memory die 108 includes a memory structure 126 of memory cells, such as an array of memory cells, control circuitry 110, and read/write circuits 128. The memory structure 126 is addressable by word lines via a row decoder 124 and by bit lines via a column decoder 123. The read/write circuits 128 include multiple sense blocks 51, 52, . . . 53 (sensing circuitry) and allow a page of memory cells to be read or programmed in parallel. Typically a controller 122 is included in the same memory device 100 (e.g., a removable storage card) as the one or more memory die 108. The controller may be separate from the memory die. Commands and data are transferred between the host 140 and controller 122 via a data bus 120, and between the controller and the one or more memory die 108 via lines 118.

The memory structure can be 2D or 3D. The memory structure may comprise one or more array of memory cells including a 3D array. The memory structure may comprise a monolithic 3D memory structure in which multiple memory levels are formed above (and not in) a single substrate, such as a wafer, with no intervening substrates. The memory structure may comprise any type of non-volatile memory that is monolithically formed in one or more physical levels of arrays of memory cells having an active area disposed above a silicon substrate. The memory structure may be in a non-volatile memory device having circuitry associated with the operation of the memory cells, whether the associated circuitry is above or within the substrate.

The control circuitry 110 cooperates with the read/write circuits 128 to perform memory operations on the memory structure 126, and includes a state machine 112 an on-chip address decoder 114, and a power control module 116 (power control circuit). The state machine 112 provides chip-level control of memory operations. A storage region 113 may be provided, e.g., for operational parameters and software/code. In one embodiment, the state machine is programmable by the software. In other embodiments, the state machine does not use software and is completely implemented in hardware (e.g., electrical circuits).

The on-chip address decoder 114 provides an address interface between that used by the host or a memory controller to the hardware address used by the decoders 123 and 124. The power control module 116 controls the power and voltages supplied to the word lines, select gate lines, bit lines and source lines during memory operations. It can include drivers for word lines, SGS and SGD transistors and source lines. See also FIG. 3. The sense blocks can include bit line drivers, in one approach.

In some implementations, some of the components can be combined. In various designs, one or more of the components (alone or in combination), other than memory structure 126, can be thought of as at least one control circuit which is configured to perform the techniques described herein including the steps of the processes described herein. For example, a control circuit such as a programming circuit may include any one of, or a combination of, control circuitry 110, state machine 112, decoders 114 and 123, power control module 116, sense blocks 51, 52, . . . , 53, read/write circuits 128, controller 122, and so forth.

The off-chip controller 122 (which in one embodiment is an electrical circuit) may comprise a processor 122c, storage devices (memory) such as ROM 122a and RAM 122b and an error-correction code (ECC) engine 245. The ECC engine can correct a number of read errors. The RAM 122b may include storage locations 130 and 131 for the assigned data states of the memory cells of WLn and WLn+1, respectively, in addition to a storage location 132 for compensation data for the memory cells of WLn. Generally, any type of storage medium can be used for these storage locations. The storage locations may store assigned data states and compensation data such as depicted in FIG. 19A-19E. The processor 122c may include a comparison circuit 133 which compares the assigned data states of WLn to the assigned data states of WLn+1 for each NAND string to determine the compensation data, such as depicted in the process of FIG. 11B.

The controller 122 or control circuitry 110 can be configured with hardware, firmware and/or software for implementing the techniques described herein.

A memory interface 122d may also be provided. The memory interface, in communication with ROM, RAM and processor, is an electrical circuit that provides an electrical interface between controller and memory die. For example, the memory interface can change the format or timing of signals, provide a buffer, isolate from surges, latch I/O and so forth. The processor can issue commands to the control circuitry 110 (or any other component of the memory die) via the memory interface 122d.

The storage device comprises code such as a set of instructions, and the processor is operable to execute the set of instructions to provide the functionality described herein. Alternatively or additionally, the processor can access code from a storage device 126a of the memory structure, such as a reserved area of memory cells in one or more word lines.

For example, code can be used by the controller to access the memory structure such as for programming, read and erase operations. The code can include boot code and control code (e.g., a set of instructions). The boot code is software that initializes the controller during a booting or startup process and enables the controller to access the memory structure. The code can be used by the controller to control one or more memory structures. Upon being powered up, the processor 122c fetches the boot code from the ROM 122a or storage device 126a for execution, and the boot code initializes the system components and loads the control code into the RAM 122b. Once the control code is loaded into the RAM, it is executed by the processor. The control code includes drivers to perform basic tasks such as controlling and allocating memory, prioritizing the processing of instructions, and controlling input and output ports.

Generally, the control code can include instructions to perform the functions described herein including the steps of the flowcharts discussed further below, and provide the voltage waveforms including those discussed further below. A control circuit can be configured to execute the instructions to perform the functions described herein.

In one embodiment, the host is a computing device (e.g., laptop, desktop, smartphone, tablet, digital camera) that includes one or more processors, one or more processor readable storage devices (RAM, ROM, flash memory, hard disk drive, solid state memory) that store processor readable code (e.g., software) for programming the one or more processors to perform the methods described herein. The host may also include additional system memory, one or more input/output interfaces and/or one or more input/output devices in communication with the one or more processors.

Other types of non-volatile memory in addition to NAND flash memory can also be used.

Semiconductor memory devices include volatile memory devices, such as dynamic random access memory ("DRAM") or static random access memory ("SRAM") devices, non-volatile memory devices, such as resistive random access memory ("ReRAM"), electrically erasable programmable read only memory ("EEPROM"), flash memory (which can also be considered a subset of EEPROM), ferroelectric random access memory ("FRAM"), and magnetoresistive random access memory ("MRAM"), and other semiconductor elements capable of storing information. Each type of memory device may have different configurations. For example, flash memory devices may be configured in a NAND or a NOR configuration.

The memory devices can be formed from passive and/or active elements, in any combinations. By way of non-limiting example, passive semiconductor memory elements include ReRAM device elements, which in some embodiments include a resistivity switching storage element, such as an anti-fuse or phase change material, and optionally a steering element, such as a diode or transistor. Further by way of non-limiting example, active semiconductor memory elements include EEPROM and flash memory device elements, which in some embodiments include elements containing a charge storage region, such as a floating gate, conductive nanoparticles, or a charge storage dielectric material.

Multiple memory elements may be configured so that they are connected in series or so that each element is individually accessible. By way of non-limiting example, flash memory devices in a NAND configuration (NAND memory) typically contain memory elements connected in series. A NAND string is an example of a set of series-connected transistors comprising memory cells and SG transistors.

A NAND memory array may be configured so that the array is composed of multiple strings of memory in which a string is composed of multiple memory elements sharing a single bit line and accessed as a group. Alternatively, memory elements may be configured so that each element is individually accessible, e.g., a NOR memory array. NAND and NOR memory configurations are examples, and memory elements may be otherwise configured.

The semiconductor memory elements located within and/or over a substrate may be arranged in two or three dimensions, such as a 2D memory structure or a 3D memory structure. In a 2D memory structure, the semiconductor memory elements are arranged in a single plane or a single memory device level. Typically, in a 2D memory structure, memory elements are arranged in a plane (e.g., in an x-y direction plane) which extends substantially parallel to a major surface of a substrate that supports the memory elements. The substrate may be a wafer over or in which the layer of the memory elements are formed or it may be a carrier substrate which is attached to the memory elements after they are formed. As a non-limiting example, the substrate may include a semiconductor such as silicon.

The memory elements may be arranged in the single memory device level in an ordered array, such as in a plurality of rows and/or columns. However, the memory elements may be arrayed in non-regular or non-orthogonal configurations. The memory elements may each have two or more electrodes or contact lines, such as bit lines and word lines.

A 3D memory array is arranged so that memory elements occupy multiple planes or multiple memory device levels, thereby forming a structure in three dimensions (i.e., in the x, y and z directions, where the z direction is substantially perpendicular and the x and y directions are substantially parallel to the major surface of the substrate).

As a non-limiting example, a 3D memory structure may be vertically arranged as a stack of multiple 2D memory device levels. As another non-limiting example, a 3D memory array may be arranged as multiple vertical columns (e.g., columns extending substantially perpendicular to the major surface of the substrate, i.e., in the y direction) with each column having multiple memory elements. The columns may be arranged in a 2D configuration, e.g., in an x-y plane, resulting in a 3D arrangement of memory elements with elements on multiple vertically stacked memory planes. Other configurations of memory elements in three dimensions can also constitute a 3D memory array.

By way of non-limiting example, in a 3D NAND memory array, the memory elements may be coupled together to form a NAND string within a single horizontal (e.g., x-y) memory device level. Alternatively, the memory elements may be coupled together to form a vertical NAND string that traverses across multiple horizontal memory device levels. Other 3D configurations can be envisioned wherein some NAND strings contain memory elements in a single memory level while other strings contain memory elements which span through multiple memory levels. 3D memory arrays may also be designed in a NOR configuration and in a ReRAM configuration.

Typically, in a monolithic 3D memory array, one or more memory device levels are formed above a single substrate. Optionally, the monolithic 3D memory array may also have one or more memory layers at least partially within the single substrate. As a non-limiting example, the substrate may include a semiconductor such as silicon. In a monolithic 3D array, the layers constituting each memory device level of the array are typically formed on the layers of the underlying memory device levels of the array. However, layers of adjacent memory device levels of a monolithic 3D memory array may be shared or have intervening layers between memory device levels.

2D arrays may be formed separately and then packaged together to form a non-monolithic memory device having multiple layers of memory. For example, non-monolithic stacked memories can be constructed by forming memory levels on separate substrates and then stacking the memory levels atop each other. The substrates may be thinned or removed from the memory device levels before stacking, but as the memory device levels are initially formed over separate substrates, the resulting memory arrays are not monolithic 3D memory arrays. Further, multiple 2D memory arrays or 3D memory arrays (monolithic or non-monolithic) may be formed on separate chips and then packaged together to form a stacked-chip memory device.

Associated circuitry is typically required for operation of the memory elements and for communication with the memory elements. As non-limiting examples, memory devices may have circuitry used for controlling and driving memory elements to accomplish functions such as programming and reading. This associated circuitry may be on the same substrate as the memory elements and/or on a separate substrate. For example, a controller for memory read-write operations may be located on a separate controller chip and/or on the same substrate as the memory elements.

One of skill in the art will recognize that this technology is not limited to the 2D and 3D exemplary structures described but covers all relevant memory structures within the spirit and scope of the technology as described herein and as understood by one of skill in the art.

Figure 2:
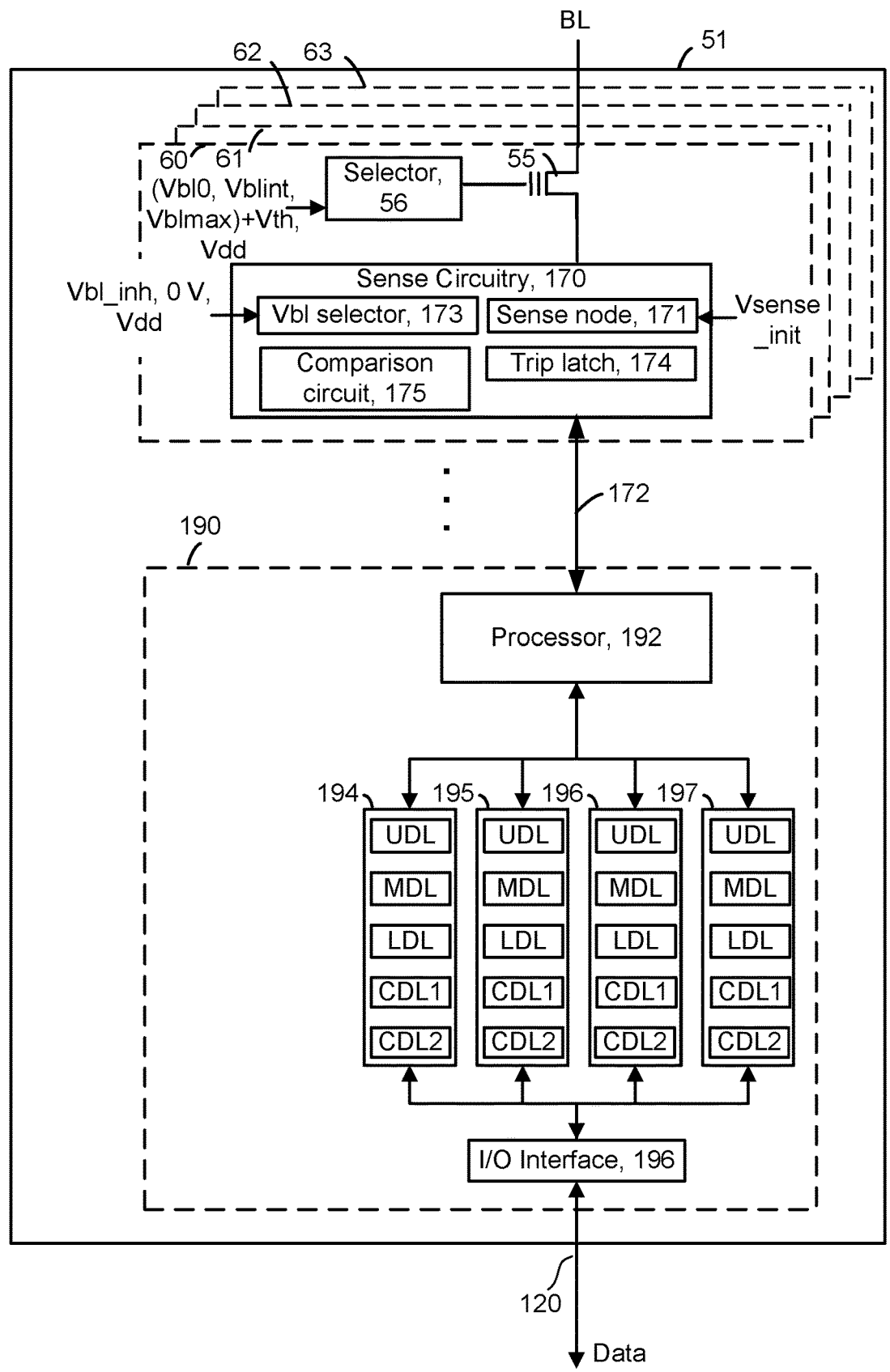
FIG. 2 is a block diagram depicting one embodiment of the sense block 51 of FIG. 1.

FIG. 2 is a block diagram depicting one embodiment of the sense block 51 of FIG. 1. An individual sense block 51 is partitioned into one or more core portions, referred to as sense circuits 60-63 or sense amplifiers, and a common portion, referred to as a managing circuit 190. In one embodiment, there will be a separate sense circuit for each bit line/NAND string and one common managing circuit 190 for a set of multiple, e.g., four or eight, sense circuits. Each of the sense circuits in a group communicates with the associated managing circuit via data bus 172. Thus, there are one or more managing circuits which communicate with the sense circuits of a set of storage elements (memory cells).

The sense circuit 60, as an example, comprises sense circuitry 170 that performs sensing by determining whether a conduction current in a connected bit line is above or below a predetermined threshold level. The sensing can occur in a read or verify operation. The sense circuit also supplies a bit line voltage during the application of a program voltage in a program operation.

The sense circuitry may include a Vbl selector 173, a sense node 171, a comparison circuit 175 and a trip latch 174. During the application of a program voltage, the Vbl selector 173 can pass an inhibit voltage Vbl_inh (e.g., 2 V) to a bit line connected to a memory cell which is inhibited from programming, or 0 V to a bit line connected to a memory cell subject to the normal programming speed. A transistor 55 (e.g., an nMOS) can be configured as a pass gate during the application of a program voltage to pass Vbl from the Vbl selector, by setting the control gate voltage of the transistor sufficiently high, e.g., higher than the Vbl passed from the Vbl selector. For example, a selector 56 may pass a power supply voltage Vdd, e.g., 3-4 V to the control gate of the transistor 55.

During sensing operations such as verify operations which occur during the application of a verification signal, the bit line voltage is set by the transistor 55 based on the voltage passed by the selector 56. In this example, one of three bit line voltages, e.g., Vbl0, Vblint and Vblmax, can be passed to the bit line. In this notation, "Vbl" denotes a bit line voltage, "0" denotes the case of no compensation, "int" denotes the case of intermediate compensation and "max" denotes the case of maximum compensation. As described in FIG. 14A, Vbl0, Vblint and Vblmax are passed when there is no compensation, an intermediate amount of compensation, or a maximum amount of compensation, respectively, in an example implementation.

The bit line voltage is roughly equal to the control gate voltage of the transistor 55 minus its Vth (e.g., 1 V). For example, if Vbl0+Vth, Vblint+Vth or Vblmax+Vth is passed by the selector 56, the bit line voltage will be Vbl0, Vblint or Vblmax, respectively. This assumes the source line is at 0 V. The transistor 55 clamps the bit line voltage according to the control gate voltage and acts a source-follower rather than a pass gate. The Vbl selector 173 may pass a relatively high voltage such as Vdd which is higher than the control gate voltage on the transistor 55 to provide the source-follower. During sensing, the transistor 55 thus charges up the bit line.

In one approach, the selector 56 of each sense circuit can be controlled separately from the selectors of other sense circuits, so that different sense circuits can pass different bit line voltages during the sensing of the verify tests. The Vbl selector 173 of each sense circuit can also be controlled separately from the Vbl selectors of other sense circuits so that different sense circuits can pass different bit line voltages during the application of the program pulse to the selected word line.

During sensing, the sense node 171 is charged up to an initial voltage such as Vsense_init=3 V. The sense node is then connected to the bit line via the transistor 55, and an amount of decay of the sense node is used to determine whether a memory cell is in a conductive or non-conductive state. The comparison circuit 175 is used to compare the sense node voltage to a trip voltage at a sense time. If the sense node voltage decays below the trip voltage Vtrip, the memory cell is in a conductive state and its Vth is at or below the voltage of the verification signal. If the sense node voltage does not decay below Vtrip, the memory cell is in a non-conductive state and its Vth is above the voltage of the verification signal. See FIG. 22C. The sense circuit 60 includes a trip latch 174 that is set by the comparison circuit 175 based on whether the memory cell is in a conductive or non-conductive state. The data in the trip latch can be a bit which is read out by the processor 192. The sense time and Vtrip can be adjusted as discussed in connection with FIGS. 14C and 14D, respectively.

The managing circuit 190 comprises a processor 192, four example sets of latches 194-197 and an I/O Interface 196 coupled between the set of data latches 194 and data bus 120. One set of data state latches, e.g., comprising individual latches LDL, MDL and UDL, and one set of compensation data latches, e.g., comprising individual latches CDL1 and CDL2, can be provided for each sense circuit. In some cases, additional data latches may be used. LDL refers to a Lower page Data Latch, MDL refers to a Middle page Data Latch, UDL refers to an Upper page Data Latch, CDL1 refers to a first Compensation Data Latch, and CDL2 refers to a second Compensation Data Latch.

The data state latches store assigned data states of the memory cells in the form of pages of data. For example, LDL stores a bit for a lower page of data, MDL stores a bit for a lower page of data, and UDL stores a bit for an upper page of data. See FIG. 17. This is in an eight-level or three-bits per memory cell memory device. One additional data latch per bit line can be provided for each additional data bit per memory cell. CDL1 and CDL2 each store a bit of compensation data, such as depicted in FIGS. 18A-18C and 19E.

The processor 192 performs computations, such as to determine the data stored in the sensed memory cell and store the determined data in the set of data latches. The processor 192 can also determine, e.g., generate, compensation data. Each set of data latches 194-197 is used to store data bits determined by processor 192 during a read operation, and to store data bits imported from the data bus 120 during a program operation which represent write data meant to be programmed into the memory. I/O interface 196 provides an interface between data latches 194-197 and the data bus 120.

During reading, the operation of the system is under the control of state machine 112 that controls the supply of different control gate voltages to the addressed memory cell. As it steps through the various predefined control gate voltages corresponding to the various memory states supported by the memory, the sense circuit may trip at one of these voltages and a corresponding output will be provided from sense circuit to processor 192 via the data bus 172. At that point, processor 192 determines the resultant memory state by consideration of the tripping event(s) of the sense circuit and the information about the applied control gate voltage from the state machine. It then computes a binary encoding for the memory state and stores the resultant data bits into data latches 194-197.

Some implementations can include multiple processors 192. In one embodiment, each processor 192 will include an output line (not depicted) such that each of the output lines is wired-OR'd together. In some embodiments, the output lines are inverted prior to being connected to the wired-OR line. This configuration enables a quick determination during a program verify test of when the programming process has completed because the state machine receiving the wired-OR can determine when all bits being programmed have reached the desired level. For example, when each bit has reached its desired level, a logic zero for that bit will be sent to the wired-OR line (or a data one is inverted). When all bits output a data 0 (or a data one inverted), then the state machine knows to terminate the programming process. Because each processor communicates with eight sense circuits, the state machine needs to read the wired-OR line eight times, or logic is added to processor 192 to accumulate the results of the associated bit lines such that the state machine need only read the wired-OR line one time. Similarly, by choosing the logic levels correctly, the global state machine can detect when the first bit changes its state and change the algorithms accordingly.

During program or verify operations for memory cells, the data to be programmed (write data) is stored in the set of data latches 194-197 from the data bus 120, in the LDL, MDL and UDL latches, in a three-bit per memory cells implementation.

The program operation, under the control of the state machine, comprises a series of programming voltage pulses applied to the control gates of the addressed memory cells. See FIG. 10A. Each program voltage is followed by a verify operation to determine if the memory cells have been programmed to the desired memory state. In some cases, processor 192 monitors the read back memory state relative to the desired memory state. When the two are in agreement, the processor 192 sets the bit line to inhibit programming such as by updating its latches. See FIG. 17. This inhibits the memory cell coupled to the bit line from further programming even if additional program pulses are applied to its control gate.

Each set of data latches 194-197 may be implemented as a stack of data latches for each sense circuit. In one embodiment, there are three data latches per sense circuit 60. In some implementations, the data latches are implemented as a shift register so that the parallel data stored therein is converted to serial data for data bus 120, and vice versa. All the data latches corresponding to the read/write block of memory cells can be linked together to form a block shift register so that a block of data can be input or output by serial transfer. In particular, the bank of read/write circuits is adapted so that each of its set of data latches will shift data in to or out of the data bus in sequence as if they are part of a shift register for the entire read/write block.

The data latches identify when an associated memory cell has reached certain mileposts in a program operations. For example, latches may identify that a memory cell's Vth is below a particular verify voltage. The data latches indicate whether a memory cell currently stores one or more bits from a page of data. For example, the LDL latches can be used to store a lower page of data. An LDL latch is flipped (e.g., from 0 to 1) when a lower page bit is stored in an associated memory cell. An MDL or UDL latch is flipped when a middle or upper page bit, respectively, is stored in an associated memory cell. This occurs when an associated memory cell completes programming.

Figure 3:
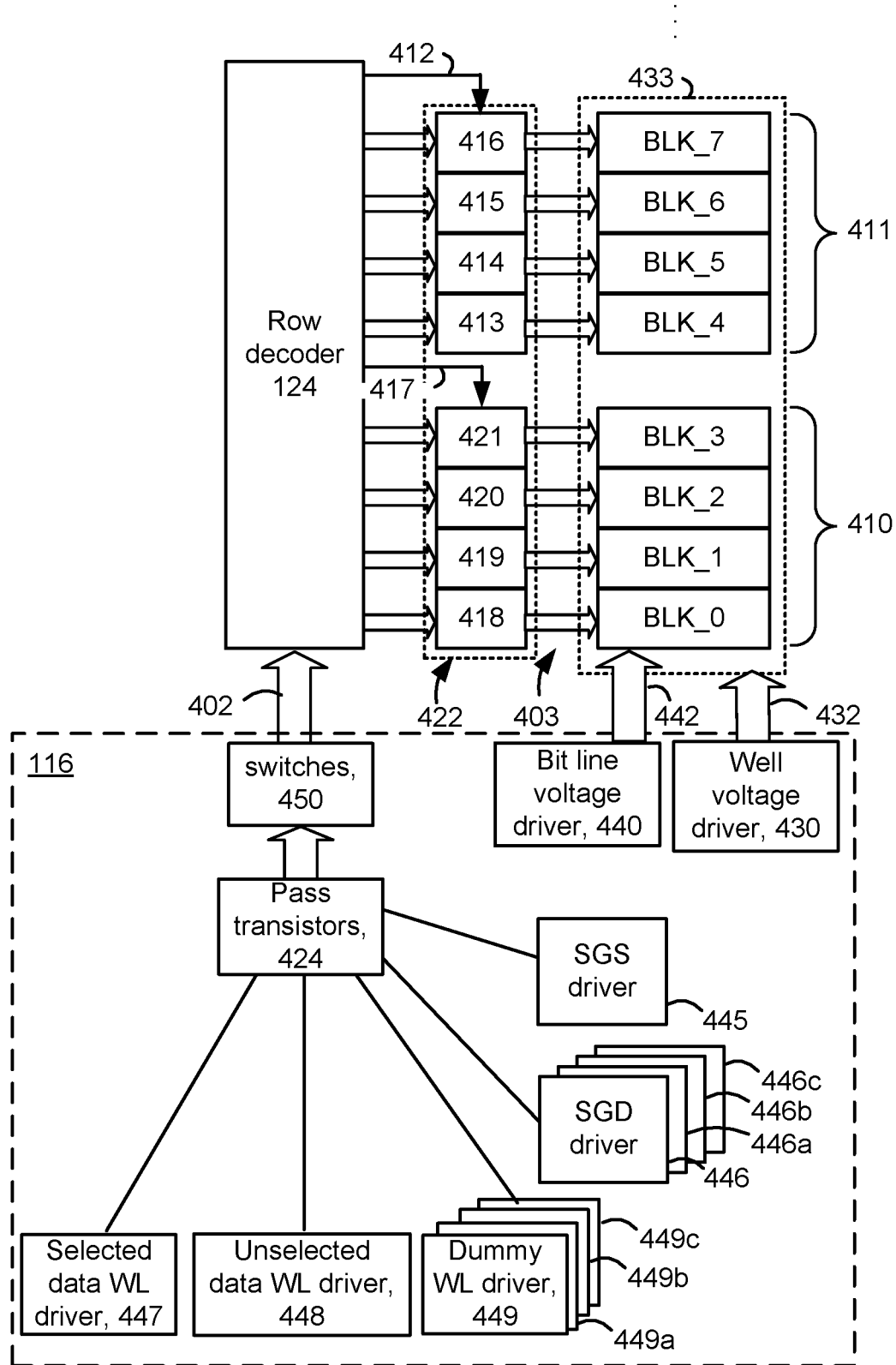
FIG. 3 depicts an example implementation of the power control module 116 of FIG. 1 for providing voltages to blocks of memory cells.

FIG. 3 depicts an example implementation of the power control module 116 of FIG. 1 for providing voltages to blocks of memory cells. In this example, the memory structure 126 includes a set 410 of four related blocks, BLK_0 to BLK_3, and another set 411 of four related blocks, BLK_4 to BLK_7. The blocks can be in one or more planes. The row decoder 124 of FIG. 1 provides voltages to word lines and select gates of each block via pass transistors 422. The row decoder provides a control signal to pass transistors which connect the blocks to the row decoder. In one approach, the pass transistors of each set of blocks are controlled by a common control gate voltage. Thus, the pass transistors for a set of block are either all on or off at a given time. If the pass transistors are on, a voltage from the row decoder is provided to the respective control gate lines or word lines. If the pass transistors are off, the row decoder is disconnected from the respective control gate lines or word lines so that the voltage floats on the respective control gate lines or word lines.

For instance, a control gate line 412 is connected to sets of pass transistors 413, 414, 415 and 416, which in turn are connected to control gate lines of BLK_4, BLK_5, BLK_6 and BLK_7, respectively. A control gate line 417 is connected to sets of pass transistors 418, 419, 420 and 421, which in turn are connected to control gate lines of BLK_0, BLK_1, BLK_2 and BLK_3, respectively.

Typically, program or read operations are performed on one selected block at a time and on one selected sub-block of the block. An erase operation may be performed on a selected block or sub-block. The row decoder can connect global control lines 402 to local control lines 403. The control lines represent conductive paths. Voltages are provided on the global control lines from a number of voltage drivers. Some of the voltage drivers may provide voltages to switches 450 which connect to the global control lines. Pass transistors 424 are controlled to pass voltages from the voltage drivers to the switches 450.

The voltage drivers can include a selected data word line (WL) driver 447, which provides a voltage on a data word line selected during a program or read operation, a driver 448 for unselected data word lines, and dummy word line drivers 449-449c which provide voltages on dummy word lines. For example, the dummy word line drivers 449, 449a, 449b and 449c may provide voltages on the control gate layers or word line layers WLDD0, WLDD1, WLDS1 and WLDS0, respectively, in FIG. 5A.

Figure 7:
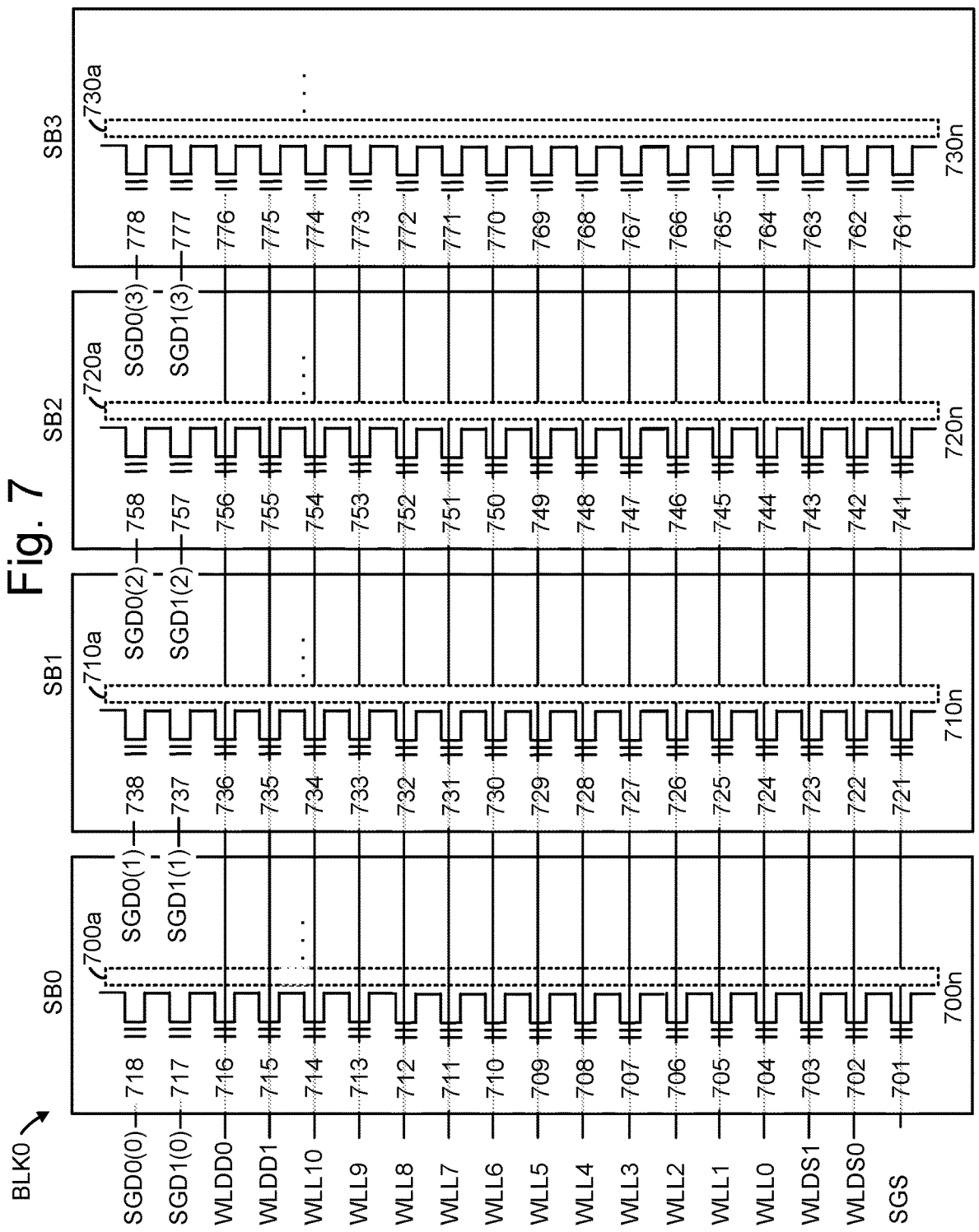
FIG. 7 depicts an example view of NAND strings in a block BLK0 which is consistent with FIGS. 4 and 5A.
Figure 8A:
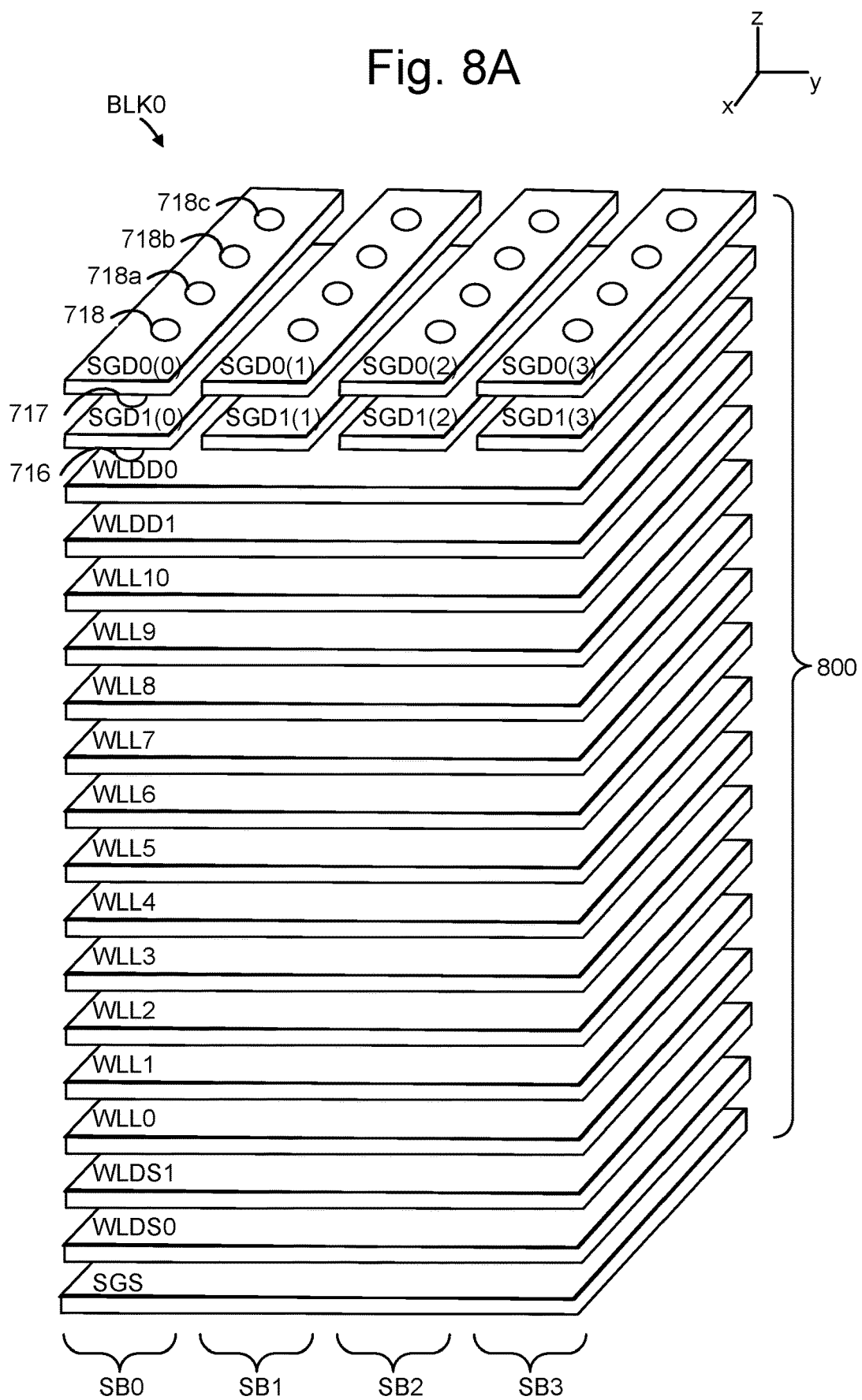
FIG. 8A depicts control gate layers in the block BLK0, consistent with FIG. 7.
Figure 8B:
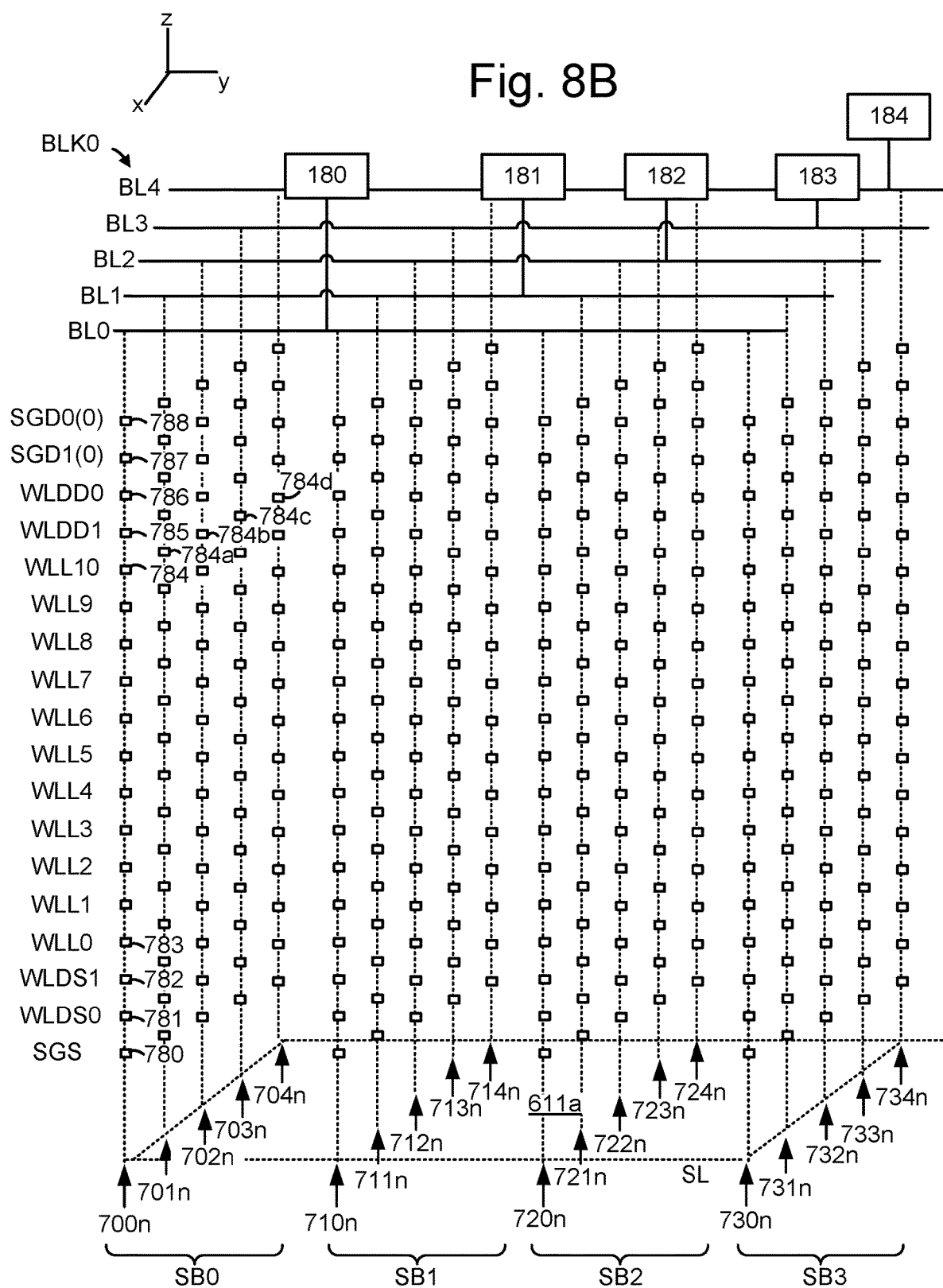
FIG. 8B depicts additional detail of the block BLK0 of FIG. 7.

The voltage drivers can also include an SGS driver 445 for a block, and separate SGD drivers 446, 446a, 446b and 446c for SB0, SB1, SB2 and SB3, respectively, such as in FIGS. 7, 8A and 8B. Moreover, in some cases, there can be multiple SGD transistors, multiple SGS transistors, multiple drain side dummy memory cells and/or multiple source side dummy memory cells in each NAND string. To provide the greatest flexibility in programming these memory cells and transistors with program voltages or other word line specific parameters, there can be a separate driver for each select gate transistor and dummy memory cell in a NAND string, in one approach.

The various components, including the row decoder, may receive commands from a controller such as the state machine 112 or the controller 122 to perform the functions described herein.

In one approach, the well region 433 is common to the blocks and may be driven by a voltage driver 430 via a path 432. A set of bit lines 442 is also shared by the blocks. A bit line voltage driver 440 provides voltages to the bit lines. In a stacked memory device such as depicted in FIGS. 4 to 8B, sets of connected memory cells may be arranged in NAND strings which extend vertically upward from the substrate. The bottom (or source end) of each NAND string is in contact with the well region, and the top end (or drain end) of each NAND string is connected to a respective bit line, in one approach.

Figure 4:
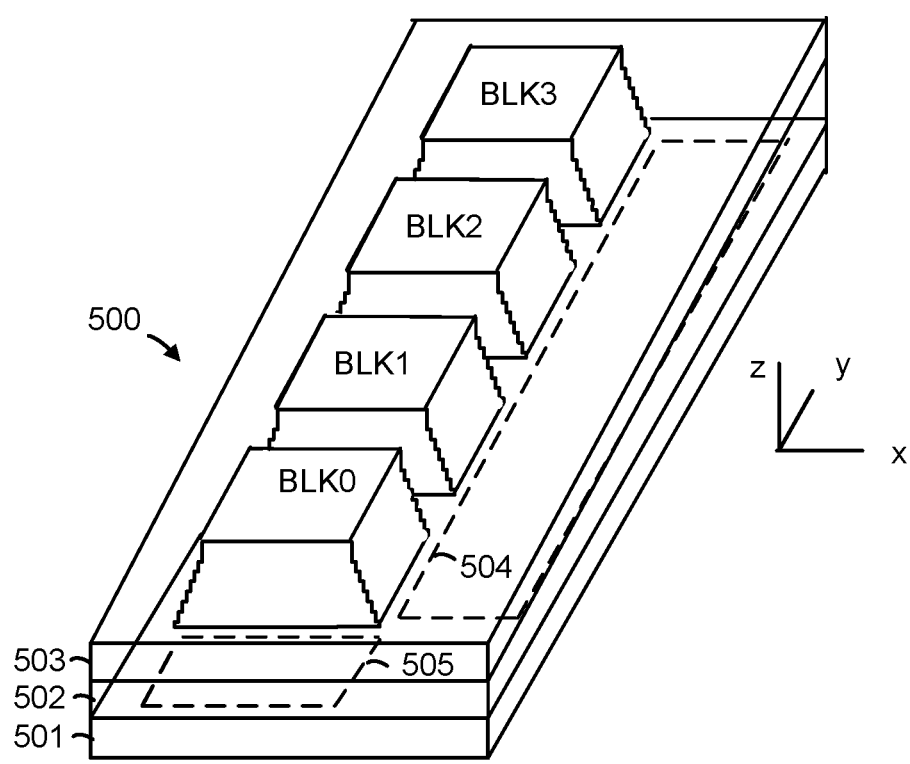
FIG. 4 is a perspective view of a memory device 500 comprising a set of blocks in an example 3D configuration of the memory structure 126 of FIG. 1.

FIG. 4 is a perspective view of a memory device 500 comprising a set of blocks in an example 3D configuration of the memory structure 126 of FIG. 1. On the substrate 501 are example blocks BLK0, BLK1, BLK2 and BLK3 of memory cells and peripheral areas with circuitry for use by the blocks. The peripheral area 504 runs along an edge of each block while the peripheral area 505 is at an end of the set of blocks. The circuitry can include voltage drivers which can be connected to control gate layers, bit lines and source lines of the blocks. In one approach, control gate layers at a common height in the blocks are commonly driven. The substrate 501 can also carry circuitry under the blocks, and one or more lower metal layers which are patterned in conductive paths to carry signals of the circuitry. The blocks are formed in an intermediate region 502 of the memory device. In an upper region 503 of the memory device, one or more upper metal layers are patterned in conductive paths to carry signals of the circuitry. Each block comprises a stacked area of memory cells, where alternating levels of the stack represent word lines. In one possible approach, each block has opposing tiered sides from which vertical contacts extend upward to an upper metal layer to form connections to conductive paths. While four blocks are depicted as an example, two or more blocks can be used, extending in the x- and/or y-directions.

In one possible approach, the blocks are in a plane, and the length of the plane, in the x-direction, represents a direction in which signal paths to word lines extend in the one or more upper metal layers (a word line or SGD line direction), and the width of the plane, in the y-direction, represents a direction in which signal paths to bit lines extend in the one or more upper metal layers (a bit line direction). The z-direction represents a height of the memory device. The blocks could also be arranged in multiple planes.

FIG. 5A depicts an example cross-sectional view of a portion of the block BLK0 of FIG. 4. The block comprises a stack 610 of alternating conductive and dielectric layers. In this example, the conductive layers comprise two SGD layers, one SGS layer, two source side dummy word line layers (or word lines) WLDS1 and WLDS0, two drain side dummy word line layers WLDD1 and WLDD0, and eleven data word line layers (or data word lines) WLL0-WLL10. WLL0 is a source side data word line and WLDS1 is a dummy word line layer which is adjacent to the source side data word line. WLDS0 is another dummy word line layer which is adjacent to WLDS1. WLL10 is a drain side data word line and WLDD1 is a dummy word line layer which is adjacent to the drain side data word line. WLDD0 is another dummy word line layer which is adjacent to WLDD1. The dielectric layers are labelled as DL1-1L19. Further, regions of the stack which comprise NAND strings 700n and 710n are depicted. Each NAND string encompasses a memory hole 618 or 619 which is filled with materials which form memory cells adjacent to the word lines. Region 622 of the stack is shown in greater detail in FIG. 6.

The stack includes a substrate 611. In one approach, a portion of the source line SL comprises a well region 611a as an n-type source diffusion layer or well in the substrate. The well region is in contact with a source end of each string of memory cells in a block. An erase pulse may be applied to this layer in an erase operation The n-type well region 611*a* is formed in a p-type well region 611*b*, which in turn is formed in an n-type well region 611*c*, which in turn is formed in a p-type semiconductor substrate 611*d*, in one possible implementation. The n-type source diffusion layer may be shared by all of the blocks in a plane, in one approach.

NAND string 700*n* has a source-end 613 at a bottom 616*b* of the stack 616 and a drain-end 615 at a top 616*a* of the stack. Metal-filled slits 617 and 620 may be provided periodically across the stack as interconnects which extend through the stack, such as to connect the source line to a line above the stack. The slits may be used during the formation of the word lines and subsequently filled with metal. A portion of a bit line BL0 is also depicted. A conductive via 621 connects the drain-end 615 to BL0.

In one approach, the block of memory cells comprises a stack of alternating control gate and dielectric layers, and the memory cells are arranged in vertically extending memory holes in the stack.

In one approach, each block comprises a terraced edge in which vertical interconnects connect to each layer, including the SGS, WL and SGD layers, and extend upward to horizontal paths to voltage drivers.

FIG. 5B depicts an example transistor 650 in BLK0. The transistor comprises a control gate CG, a drain D, a source S and a channel CH and may represent a memory cell or a select gate transistor, for example.

FIG. 6 depicts a close-up view of the region 622 of the stack of FIG. 5A. Memory cells are formed at the different levels of the stack at the intersection of a word line layer and a memory hole. In this example, SGD transistors 718 and 717 are provided above dummy memory cells 716 and 715 and a data memory cell 714. These SGD transistors are at the drain end of the NAND string.

A number of layers can be deposited along the sidewall (SW) of the memory hole 630 and/or within each word line layer, e.g., using atomic layer deposition. For example, each pillar 685 or column which is formed by the materials within a memory hole can include a blocking oxide layer 663, a charge-trapping layer 664 or film such as silicon nitride (Si3N4) or other nitride, a tunneling layer 665 (e.g., comprising a gate oxide which may degrade over time), a channel 660 (e.g., comprising polysilicon), and a dielectric core 666 (e.g., comprising silicon dioxide). A word line layer can include a metal barrier 661 and a conductive metal 662 such as Tungsten as a control gate. For example, control gates 690-694 are provided. In this example, all of the layers except the metal are provided in the memory hole. In other approaches, some of the layers can be in the control gate layer. Additional pillars are similarly formed in the different memory holes. A pillar can form a columnar active area (AA) of a NAND string.

Each NAND string or set of connected transistors comprises a channel which extends continuously from one or more source-end select gate transistors to one or more drain-end select gate transistors. For example, the channels 700*a*, 710*a*, 720*a* and 730*a* extend continuously in the NAND strings 700*n*, 710*n*, 720*n* and 730*n*, respectively. The channel 700*a* extends continuously in the NAND strings 700*n* from the SGS transistor 701 to the SGD transistors 717 and 718. The channel 700*a* is continuous in that it is uninterrupted and can therefore provide a continuous conductive path in the NAND string.

When a memory cell is programmed, electrons are stored in a portion of the charge-trapping layer which is associated with the memory cell. These electrons are drawn into the charge-trapping layer from the channel, and through the tunneling layer. The Vth of a memory cell is increased in proportion to the amount of stored charge. During an erase operation, the electrons return to the channel.

Each of the memory holes can be filled with a plurality of annular layers comprising a blocking oxide layer, a charge trapping layer, a tunneling layer and a channel layer. A core region of each of the memory holes is filled with a body material, and the plurality of annular layers are between the core region and the word line in each of the memory holes.

The NAND string can be considered to have a floating body channel because the length of the channel is not formed on a substrate. Further, the NAND string is provided by a plurality of word line layers above one another in a stack, and separated from one another by dielectric layers.

FIG. 7 depicts an example view of NAND strings in the block BLK0 which is consistent with FIGS. 4 and 5A. The NAND strings are arranged in sub-blocks of the block in a 3D configuration. Each sub-block includes multiple NAND strings, where one example NAND string is depicted. For example, SB0, SB1, SB2 and SB3 comprise example NAND strings 700*n*, 710*n*, 720*n* and 730*n*, respectively. The NAND strings have data word lines, dummy word lines and select gate lines consistent with FIG. 5A. Each sub-block comprises a set of NAND strings which extend in the x direction and which have a common SGD line or control gate layer. The NAND strings 700*n*, 710*n*, 720*n* and 730*n* are in sub-blocks SB0, SB1, SB2 and SB3, respectively. Programming of the block may occur based on a word line programming order. One option is to program the memory cells in different portions of a word line which are in the different sub-blocks, one sub-block at a time, before programming the memory cells of the next word line. Another option programs all of the memory cells in one sub-block, one word line at a time, before programming the memory cells of the next sub-block. The word line programming order may start at WL0, the source-end word line and end at WLL10, the drain-end word line, for example.

The NAND strings 700*n*, 710*n*, 720*n* and 730*n* have channels 700*a*, 710*a*, 720*a* and 730*a*, respectively.

Additionally, NAND string 700*n* includes SGS transistor 701, dummy memory cells 702 and 703, data memory cells 704, 705, 706, 707, 708, 709, 710, 711, 712, 713 and 714, dummy memory cells 715 and 716, and SGD transistors 717 and 718.

NAND string 710*n* includes SGS transistor 721, dummy memory cells 722 and 723, data memory cells 724, 725, 726, 727, 728, 729, 730, 731, 732, 733 and 734, dummy memory cells 735 and 736, and SGD transistors 737 and 738.

NAND string 720*n* includes SGS transistor 741, dummy memory cells 742 and 743, data memory cells 744, 745, 746, 747, 748, 749, 750, 751, 752, 753 and 754, dummy memory cells 755 and 756, and SGD transistors 757 and 758.

NAND string 730*n* includes SGS transistor 761, dummy memory cells 762 and 763, data memory cells 764, 765, 766, 767, 768, 769, 770, 771, 772, 773 and 774, dummy memory cells 775 and 776, and SGD transistors 777 and 778.

One or more SGD transistors are provided at the drain-end of each NAND string, and one or more SGS transistors are provided at the source-end of each NAND string. The SGD transistors in SB0, SB1, SB2 and SB3 may be driven by separate control lines SGD0(0) and SGD1(0), SGD0(1) and SGD1(1), SGD0(2) and SGD1(2), and SGD0(3) and SGD1(3), respectively, in one approach. In another approach, all of the SGD transistors in a sub-block are connected and commonly driven. The SGS transistors in SB0, SB1, SB2 and SB3 may connected to one another and commonly driven. In another approach, the SGS transistors are driven by separate control lines.

FIG. 8A depicts control gate layers in the block BLK0, consistent with FIG. 7. The control gate layers are arranged in a stack 800 and include dummy word lines layers or control gate layers WLDS0, WLDS1, WLDD0 and WLDD1, and data word line layers or control gate layers WLL0-WLL10, which are shared among the different sub-blocks SB0-SB3. The control gate layers include a common SGS control gate layer for the block, and separate SGD control gate layers for each sub-block. For example, SB0 includes SGD0(0) and SGD1(0), SB1 includes SGD0(1) and SGD1(1), SB2 includes SGD0(2) and SGD1(2), and SB3 includes SGD0(3) and SGD1(3). Additionally, four example memory holes are depicted in each sub-block. SGD transistors 718, 718*a*, 718*b* and 718*c* are depicted in SGD0(0), SGD transistor 717 is depicted in SGD1(0) and dummy memory cell 716 is depicted in WLDD0.

FIG. 8B depicts additional detail of the block BLK0 of FIG. 7. Example memory cells are depicted which extend in the x direction along word lines in each sub-block. Each memory cell is depicted as a square for simplicity. Sub-blocks SB0, SB1, SB2 and SB3 include NAND strings 700*n*-704*n*, 710*n*-714*n*, 720*n*-724*n* and 730*n*-734*n*, respectively. Bit lines are connected to sets of NAND strings. For example, a bit line BL0 is connected to NAND strings 700*n*, 710*n*, 720*n* and 730*n*, a bit line BL1 is connected to NAND strings 701*n*, 711*n*, 721*n* and 731*n*, a bit line BL2 is connected to NAND strings 702*n*, 712*n*, 722*n* and 732*n*, a bit line BL3 is connected to NAND strings 703*n*, 713*n*, 723*n* and 733*n*, and a bit line BL4 is connected to NAND strings 704*n*, 714*n*, 724*n* and 734*n*. Sense circuits may be connected to each bit line. For example, sense circuits 180-184 (similar to the sense circuits 60-63 of FIG. 2, for example) are connected to bit lines BL0-BL4, respectively.

Programming and reading can occur for selected cells in one word line and one sub-block at a time. This allows each selected cell to be controlled by a respective bit line and/or source line. For example, a set of memory cells, which includes an example memory cell 714, is connected to WLL10 in SB0. This is the drain-end data word line. WLL0 is the source-end data word line. A set of memory cells may be programmed or read concurrently. An additional set of memory cells is connected to WLL10 in each of the other sub-blocks SB1-SB3.

In this example, the source line SL or source region (well region 611*a*) is driven at a voltage Vsource.

Each NAND string includes one or more SGD transistors at the drain-end and one or more SGS transistors at the source end. In this case, there are two SGD transistors and one SGS transistor per string. Each SGD transistor may be connected to separate control line layer, as in FIG. 8A, so that it can be driven separately, or the two or more SGD transistors in a string may have their control gates connected and commonly driven.

The NAND string 700*n* includes SGD transistors 788 and 787 connected to select gate lines SGD0(0) and SGD1(0), respectively, dummy memory cells 786 and 785 connected to WLDD0 and WLDD1, respectively, and data memory cell 784 connected to WLL10. The NAND string 700*n* also includes an SGS transistor 780 connected to a select gate line SGS, dummy memory cells 781 and 782 connected to WLDS0 and WLDS1, respectively, and data memory cell 783 connected to WLL0. Data memory cells 784*a*, 784*b*, 784*c* and 784*d* in NAND strings 701*n*, 702*n*, 703*n* and 704*n*, respectively, are also connected to WLL10. For example, WLL10 may be a selected word line in a program operation, where the memory cells 784-784*d* are selected memory cells connected to the selected word line. BL0-BL5 are respective bit lines connected to the NAND strings 700*n*-704*n*, respectively.

Figure 9A:
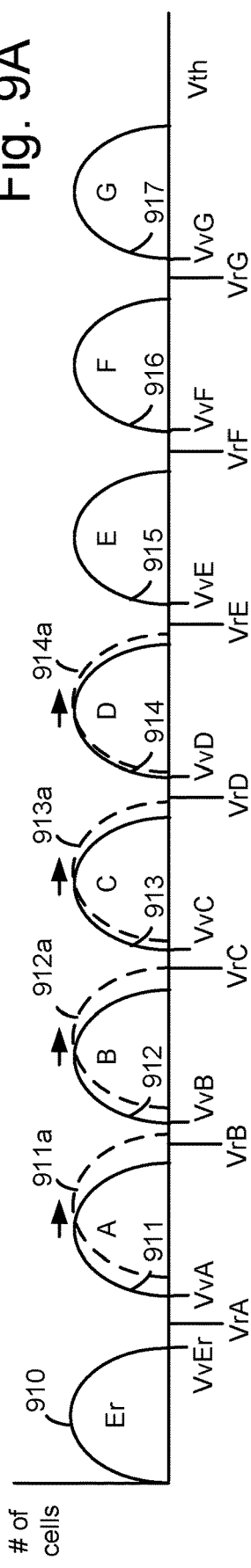
FIG. 9A depicts example threshold voltage (Vth) distributions of a set of memory cells of WLn, before and after a Vth upshift which occurs when WLn+1 is programmed, where compensation is not applied during programming of WLn.

FIG. 9A depicts example threshold voltage (Vth) distributions of a set of memory cells of WLn, before and after a Vth upshift which occurs when WLn+1 is programmed, where compensation is not applied during programming of WLn. In one approach, at a start of a program operation, the memory cells are all initially in the erased state as represented by the Vth distribution 910. After the program operation of WLn is successfully completed, and before WLn+1 is programmed, the memory cells assigned to the Er state are still represented by the Vth distribution 910. The memory cells which are programmed to the A, B, C, D, E, F and G states using the verify voltages of VvA, VvB, VvC, VvD, VvE, VvF and VvG, respectively, are represented by the Vth distributions 911, 912, 913, 914, 915, 916 and 917, respectively. The verify voltages are used in the verify operations or tests of the memory cells. The verify voltages are applied to a selected word line in a program operation.

After the memory cells of WLn+1 are programmed, the memory cells which are programmed to the A, B, C, and D states, and which experience a disturb, are represented by the Vth distributions 911*a*, 912*a*, 913*a* and 914*a*, respectively. The upshift in Vth occurs due to disturbs described above. In this example, for simplification, no upshift is depicted for the memory cells which are programmed to the E, F and G states. The arrows denote the direction of the shift, e.g., upshift. The upshift in Vth is undesirable as it increases the Vth width for each data state and can result in read errors. Moreover, the upshift is unpredictable and will be different for different memory cells. Note that some, but not all, memory cells which are programmed to the A, B, C and D states will experience a disturb. See the example of FIG. 19A-19E. The memory cells which are programmed to the A, B, C and D states, and which do not experience a disturb, continue to be represented by the Vth distributions 911, 912, 913 and 914, respectively.

Read voltages VrA, VrB, VrC, VrD, VrE, VrF and VrG can be used for reading the states of the memory cells in a read operation.

In an erase operation, the data memory cells transition from the Vth distributions of the programmed data states, e.g., states A-G, to the erased state. The erase operation includes an erase phase in which the memory cells are biased for erasing followed by an erase-verify test. The erase-verify test can use an erase verify voltage, VvEr, which is applied.

Figure 9B:
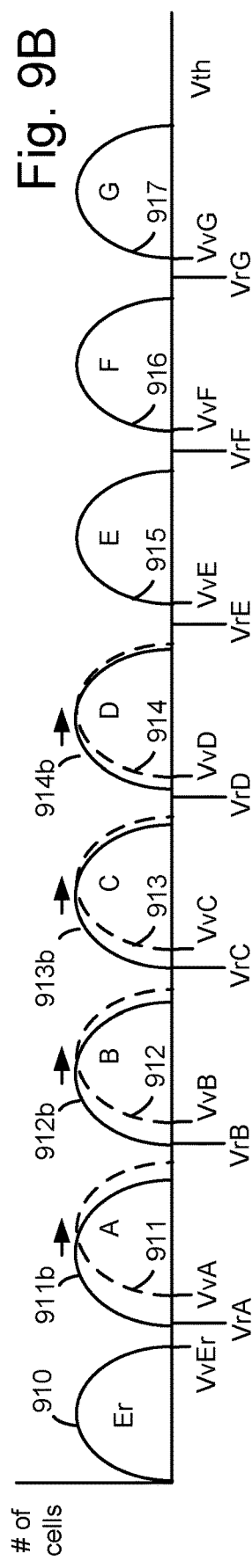
FIG. 9B depicts example Vth distributions of a set of memory cells of WLn, before and after a Vth upshift which occurs when WLn+1 is programmed, where compensation is applied during programming of WLn for some A-D state memory cells.

FIG. 9B depicts example Vth distributions of a set of memory cells of WLn, before and after a Vth upshift which occurs when WLn+1 is programmed, where compensation is applied during programming of WLn for some A-D state memory cells. A memory cell which is subject to compensation will complete programming, e.g., reach a lockout condition in which it is inhibited from further programming, when its Vth reaches a specified level which is lower than when no compensation is applied. Similarly, a memory cell which is subject to a high amount of compensation will complete programming when its Vth reaches a specified level which is lower than when a low amount of compensation is applied. Various compensation techniques can be used as discussed herein.

The memory cells which are programmed to the A, B, C and D states using compensation are represented by the Vth distributions 911*b*, 912*b*, 913*b* and 914*b*, respectively, which are downshifted relative to the Vth distributions 911, 912, 913 and 914, respectively. The memory cells which are programmed to the A, B, C and D states without compensation continue to be represented by the Vth distributions 911, 912, 913 and 914, respectively. Similarly, the memory cells which are programmed to the E, F and G states (without compensation) continue to be represented by the Vth distributions 915, 916 and 917, respectively.

After the memory cells of WLn+1 are programmed, the memory cells which are programmed to the A, B, C and D states with compensation are upshifted from the Vth distributions 911*b*, 912*b*, 913*b* and 914*b* to the Vth distributions 911, 912, 913 and 914, respectively, as in FIG. 9A. The upshift in Vth counteracts the lower Vth which was achieved during programming with compensation. The arrows denote the upshift. The upshift in Vth is desirable since it decreases the Vth width for each data state. The memory cells which are programmed to the A, B, C and D states without compensation continue to be represented by the Vth distributions 911, 912, 913 and 914, respectively, and the memory cells which are programmed to the E, F and G states (without compensation) continue to be represented by the Vth distributions 915, 916 and 917, respectively.

Figure 9C:
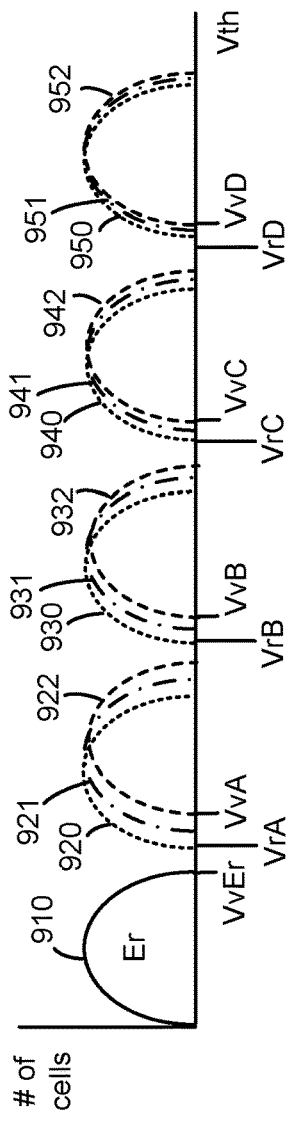
FIG. 9C depicts portions of the Vth distributions for memory cells assigned to the A, B, C and D data states of FIG. 9B, including portions representing memory cells with a maximum amount of compensation, an intermediate amount of compensation and no compensation.

FIG. 9C depicts portions of the Vth distributions for memory cells assigned to the A, B, C and D data states of FIG. 9B, including portions representing memory cells with a maximum amount of compensation, an intermediate amount of compensation and no compensation. In the example of FIG. 9B, the Vth distributions 911*b* and 911 represent memory cells assigned to the A state and programmed with and without compensation, respectively. The Vth distributions 912*b* and 912 represent memory cells assigned to the B state and programmed with and without compensation, respectively. The Vth distributions 913*b* and 913 represent memory cells assigned to the C state and programmed with and without compensation, respectively. The Vth distributions 914*b* and 914 represent memory cells assigned to the D state and programmed with and without compensation, respectively.

FIG. 9C notes that more than one amount of compensation can be provided. The Vth distributions 920, 921 and 922 represent memory cells assigned to the A state and programmed with a maximum amount of compensation, an intermediate amount of compensation and no compensation, respectively. The Vth distributions 930, 931 and 932 represent memory cells assigned to the B state and programmed with a maximum amount of compensation, an intermediate amount of compensation and no compensation, respectively. The Vth distributions 940, 941 and 942 represent memory cells assigned to the C state and programmed with a maximum amount of compensation, an intermediate amount of compensation and no compensation, respectively. The Vth distributions 950, 951 and 952 represent memory cells assigned to the D state and programmed with a maximum amount of compensation, an intermediate amount of compensation and no compensation, respectively.

Compared to the Vth of memory cells with no compensation, a relatively low Vth is provided for memory cells with a maximum amount of compensation, and a moderately low Vth is provided for memory cells with an intermediate amount of compensation.

The memory cells which are programmed to the E, F and G states (without compensation) continue to be represented by the Vth distributions 915, 916 and 917, respectively, and are omitted here for simplicity.

After the memory cells of WLn+1 are programmed, the WLn memory cells which are programmed to the A, B, C and D states with the maximum or intermediate amount of compensation are represented by the Vth distributions 911, 912, 913 and 914, respectively, as in FIG. 9A. The upshift in Vth counteracts the lower Vth which was achieved during programming with compensation. The memory cells which are programmed to the A, B, C and D states without compensation continue to be represented by the Vth distributions 911, 912, 913 and 914, respectively, and the memory cells which are programmed to the E, F and G states (without compensation) continue to be represented by the Vth distributions 915, 916 and 917, respectively, as in FIG. 9B.

FIG. 10A depicts a voltage signal used in a series of program-verify iterations in an example program operation which results in the Vth distributions of FIG. 9A-9C. The vertical axis depicts voltage and the horizontal axis depicts a number of program-verify iterations (PVIs). During a program operation, program-verify iterations are performed for a selected word line, WLn, in a selected block. A program-verify iteration comprises a program portion in which a program voltage or pulse is applied to the selected word line followed by a verify portion in which one or more verification signals are applied to the selected word line. During the application of the verification signals, verify operations, also referred to as verify tests, are performed for the associated memory cells.

The voltage signal 1000 includes a series of program voltages, including an initial program voltage 1001, which are applied to a word line selected for programming. In this example, the voltage signal includes program voltages which increase stepwise in amplitude in one or more program-verify iterations of a programming pass using a fixed or varying step size. This is referred to as incremental step pulse programming, where the program voltage starts at an initial level, Vpgm_int, and increases in a step in each successive program-verify iteration, for instance, until the program operation is completed. The operation is successfully completed when the threshold voltages of the selected memory cells reach the final verify voltages of the assigned data states.

A program operation can include a single programming pass or multiple programming passes, where each pass uses incremental step pulse programming, for instance.

Figure 10B:
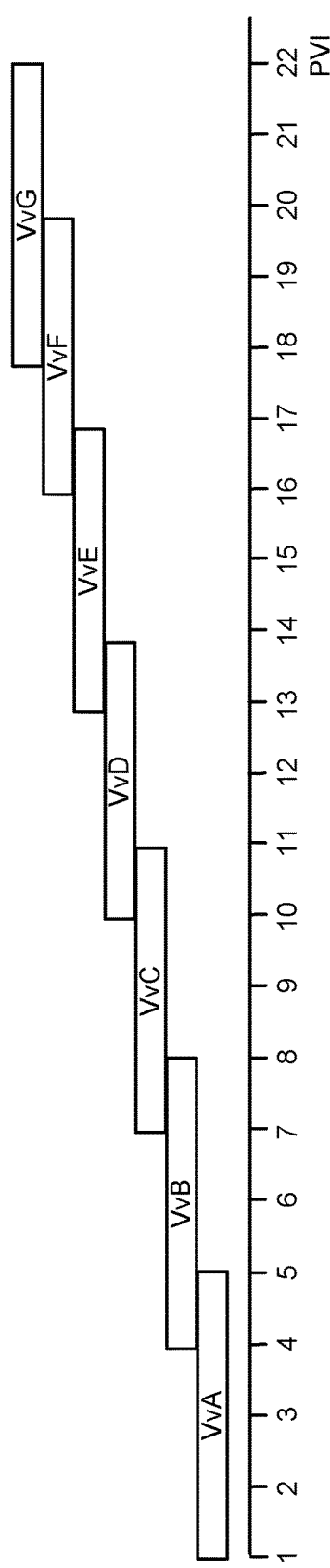
FIG. 10B depicts an example of the verification of different data states in the different program-verify iterations of FIG. 10A.

The verification signals in each program-verify iteration, including example verification signals 1002, can include verify voltages of the assigned data states which are being verified. The verify tests can encompass lower assigned data states and then midrange assigned data states and then higher assigned data states as the program operations proceeds, as depicted in FIG. 10B. The example verification signals depict three verify voltages as a simplification. As used herein, a verification signal comprises a signal is applied to a selected word line during a program-verify iteration after the application of a program voltage to the selected word line. The verification signal is part of a sensing operation. Memory cells are sensed during the application of the verification signal to judge their programming progress. A verification signal includes one or more voltages which are used to judge the programming progress of a memory cell. The verification signal can include a verify voltage which is used to judge whether the memory cell has completed programming to an assigned data state. The result of sensing of the Vth relative to a verify voltage can be used to inhibit further programming of a memory cell.

The data which is programmed or read can be arranged in pages. For example, with four data states, or two bits per cell, two pages of data can be stored. An example encoding of bits for the Er, A, B and C states is 11, 10, 00 and 01, respectively, in the format of upper page (UP) bit/lower page (LP) bit. A lower page read may use VrA and VrC and an upper page read may use VrB.

With eight data states, or three bits per cell, three pages of data can be stored. An example encoding of bits for the A-G states is provided in FIG. 17. The data of the lower page can be determined by reading the memory cells using read voltages of VrA and VrE. The data of the middle page can be determined by reading the memory cells using read voltages of VrB, VrD and VrF. The data of the upper page can be determined by reading the memory cells using read voltages of VrC and VrG.

FIG. 10B depicts an example of the verification of different data states in the different program-verify iterations of FIG. 10A. The horizontal axis depicts the number of PVIs and is time-aligned with the horizontal axis of FIG. 10A. The bars overlap in some program-verify iterations, indicating that verify operations can be performed for multiple data states in the program-verify iteration. The bars indicate that VvA, VvB, VvC, VvD, VvE, VvF and VvG are applied in verification signals in program-verify iterations 1-5, 4-8, 7-11, 10-14, 13-17, 16-20 and 18-22, respectively. The techniques provided herein optimize the initiation of verify operations for the B-G data states.

FIG. 11A depicts a flowchart of an example process for programming memory cells of a word line WLn using compensation data. The process of FIG. 11A can be performed by the controller 122 of FIG. 1, for example. Step 1100 includes receiving data for a selected word line, WLn. For example, the data may be received by the controller 122 of FIG. 1 from the host 140. The data may be in the form of pages of data such as depicted in FIG. 19B. Step 1101 includes receiving data for an adjacent, later programmed word line, WLn+1. The data may be in the form of pages of data such as depicted in FIG. 19D. Step 1102 includes comparing the WLn data to the WLn+1 data to generate compensation data for WLn. See example details of this process in FIG. 11B and example compensation data in FIG. 19E. Step 1103 includes updating latches with the compensation data and assigned data states for WLn. For example, see FIGS. 2, 17 and 18A-18C. The compensation data and assigned data state can be stored in the latches. Step 1104 includes programming the memory cells of WLn while compensating for differences between the data states of WLn and WLn+1 based on the compensation data. See further details in FIGS. 12 and 13.

By compensating the memory cells during programming for a future Vth upshift, other time-consuming techniques such as read compensation can be avoided. The Vth margin is improved so that the number of read errors is reduced. The programming technique can be referred to as a data look ahead technique since it looks ahead to the WLn+1 data when programming WLn.

FIG. 11B depicts a flowchart of an example process for generating the compensation data of step 1102 of FIG. 11A. The process can be implemented using the comparison circuit 133 of FIG. 1, for instance. The process can be performed for each memory cell of WLn which is involved in the program operation. This could include all of the memory cells connected to WLn or some subset of the memory cells such as half of the memory cells connected to WLn. Step 1110 includes determining an assigned data state of a memory cell of WLn from page data for WLn. For example, see the page data of FIG. 19B and the corresponding assigned data states of FIG. 19A. Step 1111 includes determining an assigned data state of a memory cell of WLn+1 from page data for WLn+1. For example, see the page data of FIG. 19D and the corresponding assigned data states of FIG. 19C. Step 1112 involves comparing the assigned data states.

Step 1113 includes, if the assigned data state of WLn+1 does not exceed the assigned data state of WLn by a first number of data states, setting compensation data to indicate no compensation. In the example of FIG. 15B, the first number of data states is three data states. Step 1114 includes, if the assigned data state of WLn+1 exceeds the assigned data state of WLn by the first number of data states but not a second number of data states, set the compensation data to indicate intermediate compensation. In the example of FIG. 15B, the second number of data states is six data states.

Step 1115 includes, if the assigned data state of WLn+1 exceeds the assigned data state of WLn by the second number of data states, setting the compensation data to indicate maximum compensation. The amount of compensation is therefore set as an increasing function of a difference between an assigned data state of a selected memory cell of WLn and an assigned data state of an adjacent memory cell of WLn+1, when the assigned data state of the adjacent memory cell of WLn+1 is greater than the assigned data state of the selected memory cell of WLn.

The amount of compensation can be a function of an amount (e.g., a number of data states) by which the assigned data state of the adjacent memory cell exceeds the assigned data state of the selected memory cell.

Additionally, the amount of compensation and the corresponding parameter which is set in the verify test, can be a function of the assigned data state of the selected memory cell. For example, more compensation may be provided for a low state WLn memory cell than for a high state WLn memory cell, even when the WLn+1 memory cell is the same number of states higher than the WLn memory cell. See FIG. 15C.

Figure 12:
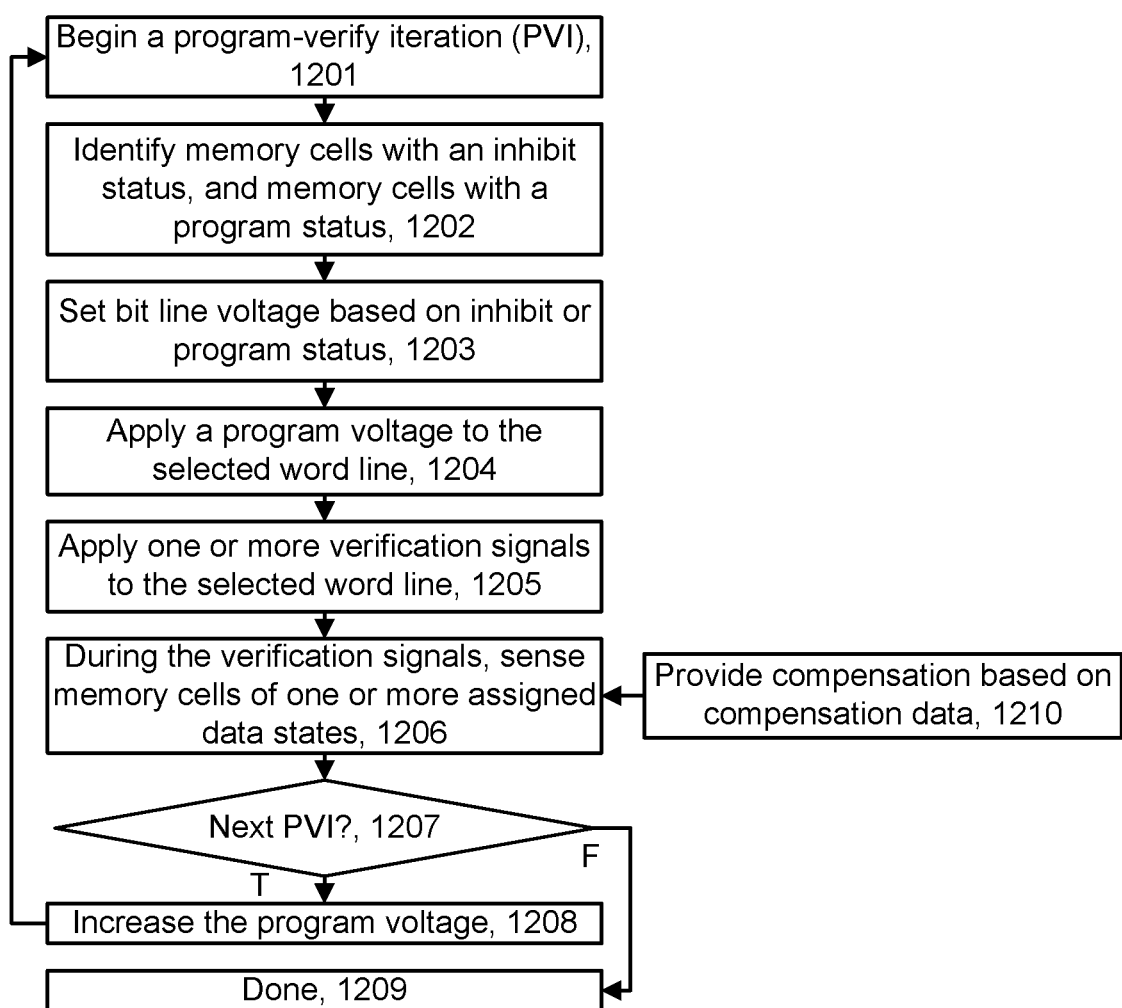
FIG. 12 depicts a flowchart of an example program operation consistent with step 1104 of FIG. 11A.

FIG. 12 depicts a flowchart of an example program operation consistent with step 1104 of FIG. 11A. Step 1201 begins a program-verify iteration (PVI). Step 1202 includes identifying memory cells with an inhibit status, and memory cells with a program status. This can involve reading the data state latches and interpreting the data in them such as by using the information of FIG. 17. If the data state latches are set to 111, for instance, the associated memory cell has an inhibit status. Otherwise, the associated memory cell has a program status. Step 1203 includes setting a bit line voltage based on the inhibit or program status, e.g., to Vbl_inh or 0 V, respectively. Step 1204 includes applying a program voltage or pulse to the selected word line while the bit line voltages are set as in step 1203. Step 1205 includes applying one or more verification signals to the selected word line. See the example verification signals in FIGS. 14A and 14E. Step 1206 includes, during the verification signals, sensing the memory cells of one or more assigned data states. This step can be responsive to step 1210, which involves providing compensation based on compensation data. See FIG. 13 for further details.

A decision step 1207 determines whether a next program-verify iteration should be performed. If the decision step is true, the program voltage is increased at step 1208 and a next program-verify iteration begins at step 1201, if programming has not been completed for all data states. If the decision step 1207 is false, the program operation is done at step 1209.

Figure 13:
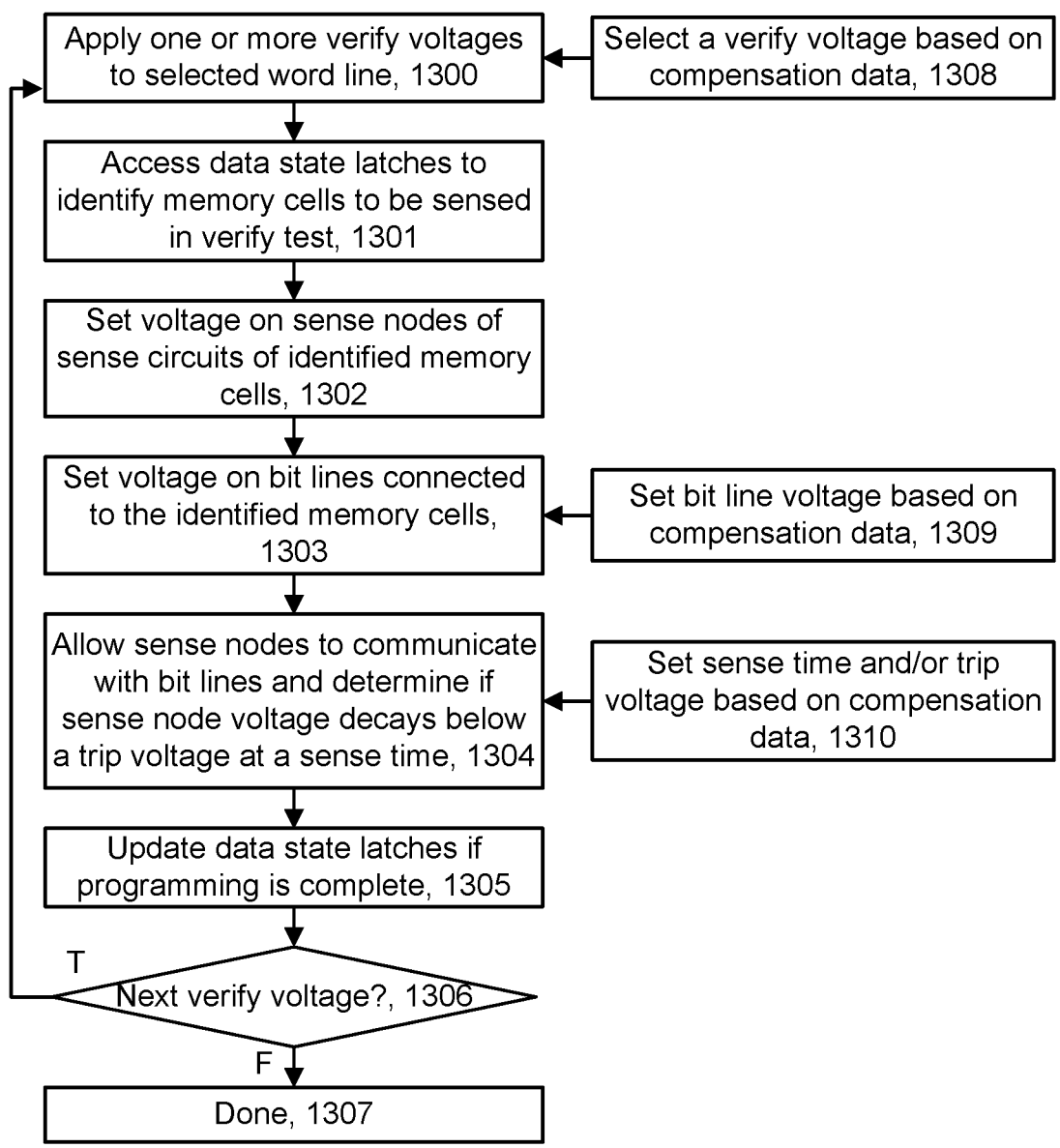
FIG. 13 depicts a flowchart of an example verify process consistent with steps 1205, 1206 and 1210 of FIG. 12.

FIG. 13 depicts a flowchart of an example verify process consistent with steps 1205, 1206 and 1210 of FIG. 12. Step 1300 includes applying one or more verify voltages to a selected word line. Step 1308 involves selecting a verify voltage based on compensation data. For example, the verify voltages VvAmax, VvAint and VvA may be applied to WLn as depicted in FIG. 14E in connection with A state verify tests. For a memory cell subject to a maximum amount of compensation, an intermediate amount of compensation, or no compensation, the associated compensation data indicates that the sensing occurs when VvAmax, VvAint or VvA, respectively, is applied. The maximum amount of compensation is more than the intermediate amount.

Step 1301 includes accessing data state latches to identify memory cells to be sensed in a verify test. For example, the memory cells to be sensed can be those which have a program status and are assigned to a data state which matches the current verify voltage applied to the selected word line. Step 1302 includes setting a voltage on the sense nodes of the sense circuits of the identified memory cells. These are sense nodes connected to the identified memory cells via respective bit lines of respective NAND strings. For example, the voltage Vsense can be provided to the sense node 171 in FIG. 2.

Step 1303 includes setting a voltage on bit lines connected to the identified memory cells. For example, the selector 56 in FIG. 2 can provide the voltage Vbl on the bit line BL. Step 1309 involves setting a bit line voltage based on compensation data. For example, the bit line voltages Vblmax, Vblint and Vbl0 may be applied as depicted in FIG. 14A. For a memory cell subject to a maximum amount of compensation, an intermediate amount of compensation, or no compensation, the associated compensation data indicates that the sensing occurs when Vblmax, Vblint or Vbl0, respectively, is applied.

Step 1304 includes allowing the sense nodes to communicate with the respective bit lines and determining, for each of the sense nodes involved in the sensing, if the sense node voltage decays below a trip voltage at a sense time. Step 1310 involves setting a sense time (sense node discharge duration) and/or trip voltage based on compensation data. The sense time is the time at the end of the discharge duration. For example, the discharge durations Ts_max, Ts_int and Ts_0 may be applied as depicted in FIG. 14C. For a memory cell subject to a maximum amount of compensation, an intermediate amount of compensation, or no compensation, the associated compensation data indicates that the sensing occurs when Ts_max, Ts_int or Ts_), respectively, is used.

Step 1305 includes updating the data state latches, e.g., to 111, to inhibit the memory cell from further programming if programming is complete for the memory cell. Programming is complete if the sense node voltage does not decay below the trip voltage at the sense time. In this case, it is concluded that the memory cell is in a non-conductive state and has a Vth at or above a desired level. Programming is not complete if the sense node voltage decays below the trip voltage at the sense time. In this case, it is concluded that the memory cell is in a conductive state and has a Vth below a desired level.

A decision step 1306 determines if there is a next verify voltage to apply in the current program-verify iteration. If the decision step is true, the process is repeated at step 1300. If the decision step is false, the process is done at step 1307.

FIG. 14A depicts examples of voltage signals which can be used in a program loop of a program operation, consistent with FIG. 12. The period of time depicted corresponds to one program-verify iteration and include a program portion followed by a verify operation. The program portion includes a pre-charge phase 1437 (t0-t3) and a program phase 1438 (t3-t9). The verify operation includes a verify phase 1439 (t9-t11). The vertical dimension denotes voltage and the horizontal dimension denotes time, with time points t0-t11. A voltage signal 1400 represents VWLn, the voltage of the selected word line, WLn, a voltage signal 1410 represents VWL_unsel, a voltage of unselected word lines, a voltage signal 1420 represents the select gate voltages, e.g., Vsgd and/or Vsgs, and a voltage signal 1430 represents Vbl, a bit line voltage.

In the pre-charge phase, a positive Vbl, e.g., 2 V, is provided to the drain-side of the channels of the NAND strings to remove residue electrons and to provide a small amount of boosting such as 1-2 V. The SGD transistors of the selected and unselected sub-blocks are in a conductive state at this time, with a voltage of 6 V, for example. This allows the bit line voltage to be passed to the drain end of the channel. The SGS transistors of the selected and unselected sub-blocks may also be in a conductive state at this time, with a voltage of 6 V, for example, to allow the source line voltage (Vsl) to be passed to the source end of the channel.

In the program phase, the word line voltages are ramped up, e.g., starting at t3, to provide the associated memory cells in a conductive state and to provide a capacitive coupling up of the associated channel regions of the unselected NAND strings. VWLn is then ramped up further at t5 to the peak program voltage of Vpgm and held at Vpgm until t6 to program the selected memory cells.

In the verify phase, one or more verify tests are performed by applying verification signals 1401 and 1402 of one or more data states on the selected word line. In this example, a verification signal 1401 for the A-state includes the verify voltage VvA and the verification signal 1402 for the B-state includes the verify voltage VvB. During the application of each verify voltage, selected memory cells are sensed to determine if they are in a conductive or non-conductive state. In another option, depicted in FIG. 14E, there are multiple verify voltages for one data state and the verify test for a memory cell is performed when one of the verify voltages is applied, based on the compensation data of the memory cell. See step 1308 of FIG. 13.

VWL_unsel may be the same in the verify phase as the program phase, in one approach. This voltage is referred to as Vpass in the program phase and Vread in the verify phase. Vpass/Vread represents a voltage which is a voltage which is sufficiently high to place the associated memory cells in a strongly conductive state. In one option, VWL_unsel is kept at Vpass/Vread between the program and verify phases. In another option, VWL_unsel is reduced from Vpass/Vread to 0 V at the end of the program phase and then increased from 0 V to Vpass/Vread at the start of the verify phase.

VWLn is at an initial voltage such as 0 V during the pre-charge phase. VWLn then increases from the initial voltage to Vpass, starting at t3, in a time period t3-t4, and is held at Vpass from t4-t5. VWLn then increases from Vpass to Vpgm starting at t5, and is held at a peak voltage Vpgm until t6. VWLn then decreases from Vpgm back to the initial voltage starting at t6 and is held at the initial voltage until t9. During the verify phase, VWLn increases in steps to one or more verify voltages. For example, VWLn may increase from 0 V to VvA at t9, from VvA to VvBi at t10, and back to the initial voltage at t11.

The voltage signal 1420 represents the select gate voltages including the select gate voltage Vsg_sel for a selected sub-block (plot 1421) and the select gate voltage Vsg_unsel for an unselected sub-block (plot 1422).

The voltage signal 1430 represents the bit line voltages including 0 V for selected bit lines connected to memory cells being programmed (plot 1431), and Vbl_inh (e.g., 2 V)

for unselected bit lines connected to memory cells inhibited from programming (plot 1433).

During the program and verify phases, Vsg_sel can be set to, e.g., 2.5 V and 0 V, respectively, for the selected sub-block (plot 1421) and the unselected sub-blocks (plot 1422). Vbl can be set to Vbl0 (voltage signal 1434), Vblint (voltage signal 1435) or Vblmax (voltage signal 1436), for example, based on compensation data.

FIG. 14B depicts example voltages of the sense node 171 of FIG. 2 during verify operations consistent with the verify phase of FIG. 14A and with step 1309 of FIG. 13, where three different bit line voltages are used. As mentioned, the sensing process can involve connecting a sense node of a sense circuit to a bit line and observing whether the sense node voltage discharges below a trip voltage at a sense time (i.e., whether the memory cell is conducting current). The voltages include Vsense_init, which is the initial sense node voltage such as 3 V, Vtrip which is the trip voltage such as 2.5 V, and Vsense_final which is a floor voltage for Vsense, such as 2 V. The period in which the sense node can discharge is t9.1-t10 and t10.1-t11 during sensing with VvA and VvB, respectively, applied to the word line WLn. The sense time in which the sense node voltage is compared to Vtrip is t9.2 or t10.2 during sensing with VvA and VvB, respectively, applied to the word line, and the sense node discharge duration is Ts_0.

Three example sense node voltages of plots 1450, 1451 and 1452 correspond to bit line voltages of Vbl0, Vblint and Vblmax, respectively, where Vbl0>Vblint>Vblmax. For a selected memory cell which is close to completing programming, with a relatively high voltage of Vbl0, e.g., 0.4 V, the NAND string current will be relatively high, leading to a relatively fast sense node discharge rate. With an intermediate voltage of Vblint, e.g., 0.3 V, the NAND string current will be at an intermediate level, leading to a moderate sense node discharge rate. With a relatively low voltage of Vblmax, e.g., 0.2 V, the NAND string current will be relatively low, leading to a relatively slow discharge rate.

When a WLn memory cell is sensed during a verify test with Vblmax=0.2 V instead of with Vbl0=0.4 V, the Vth will appear to be about 0.2 V higher due to drain-induced barrier lowering (DIBL) so that the memory cell will pass the verify test sooner in the program operation. If the WLn memory cell is read back using the normal level of Vbl0=0.4 V before WLn+1 is programmed, the Vth will appear to be about 0.2 V lower compared to the case of using 0.4 V in the verify test and reading back with the normal level. The programming of the WLn+1 memory cell shifts the Vth of the WLn memory cell higher by 0.2 V so that the compensation is offset and the Vth is at a desired level.

Similarly, when a WLn memory cell is sensed during a verify test with Vblint=0.3 V instead of with Vbl0=0.4 V, the Vth will appear to be about 0.1 V higher. If the WLn memory cell is read back using the normal level of Vbl0=0.4 V before WLn+1 is programmed, the Vth will appear to be about 0.1 V lower compared to the case of using 0.4 V in the verify test and reading back with the normal level. The programming of the WLn+1 memory cell shifts the Vth of the WLn memory cell higher by 0.1 V so that the compensation is offset and the Vth is at a desired level.

When Vbl is relatively low, the memory cell will reach the lockout condition relatively early in the program operation and thus be programmed to a relatively low Vth, such as depicted by the Vth distribution 920, 930, 940 or 950 in FIG. 9C. When Vbl is relatively high, the memory cell will reach the lockout condition relatively late in the program operation and thus be programmed to a relatively high Vth, such as depicted by the Vth distribution 922, 932, 942 or 952 in FIG. 9C. When Vbl is at an intermediate level, the memory cell will reach the lockout condition at a time which is neither relatively early nor relatively late in the program operation and thus be programmed to an intermediate Vth such as depicted by the Vth distribution 921, 931, 941 or 951 in FIG. 9C.

For a selected memory cell which has completed completing programming, there will be little or no decay in the sense node voltage, as depicted by the plot 1453.

FIG. 14C depicts example voltages of the sense node 171 of FIG. 2 during verify operations consistent with the verify phase of FIG. 14A and with step 1310 of FIG. 13, where three different sense node discharge durations are used. As in FIG. 14B, the period in which the sense node can discharge is t9.1-t10 and t10.1411 during sensing with VvA and VvB, respectively, applied to the word line. An example sense node voltage 1454 represents a memory cell which is close to completing programming, and an example sense node voltage 1455 represents a memory cell which has completed programming.

When VvA is applied to the selected word line, the sense node discharge durations are t9.1-t9.2a, t9.1-9.2b and t9.1-t9.2c and the sense times are Ts_max, Ts_int and Ts_0, respectively, where Ts_max<Ts_int<Ts_0. When VvB is applied to the selected word line, the sense node discharge durations are t10.1-t10.2a, t10.1-10.2b and t10.1-t10.2c and the sense times are Ts_max, Ts_int and Ts_0, respectively.

When the sense node discharge duration is relatively short, the memory cell will reach the lockout condition relatively early in the program operation and thus be programmed to a relatively low Vth. When the sense node discharge duration is relatively long, the memory cell will reach the lockout condition relatively late in the program operation and thus be programmed to a relatively high Vth. When the sense node discharge duration is at an intermediate level, the memory cell will reach the lockout condition at a time which is neither relatively early nor relatively late in the program operation and thus be programmed to an intermediate Vth. Generally, when the discharge duration is shorter, it is equivalent to sensing at a higher sensing current (Isense), or sensing a higher Vth given the same I-V curve. Therefore, using a shorter discharge duration during verify corresponds to shifting the Vth higher.

FIG. 14D depicts example voltages of the sense node 171 of FIG. 2 during verify operations consistent with the verify phase of FIG. 14A and with step 1310 of FIG. 13, where three different trip voltages are used, e.g., Vtrip_0, Vtrip_int and Vtrip_max, where Vtrip_0<Vtrip_int<Vtrip_max. To provide compensation, a trip voltage can be increased above a level which is used for the case of no compensation. Increasing the trip voltage has a similar effect as reducing the sense node discharge duration. Thus, when the trip voltage is relatively low (e.g., Vtrip_0), the memory cell will reach the lockout condition relatively later in the program operation and thus be programmed to a relatively high Vth. When the trip voltage is relatively high (e.g., Vtrip_max), the memory cell will reach the lockout condition relatively early in the program operation and thus be programmed to a relatively low Vth. When the trip voltage is at an intermediate level (e.g., Vtrip_int), the memory cell will reach the lockout condition at a time which is neither relatively early nor relatively late in the program operation and thus be programmed to an intermediate Vth.

The sense node voltage (plot 1456) represents a memory cell which has completed programming. The sense node voltage 1457 represents a memory cell which may or may not have completed programming, depending on the trip voltage which is used. For example, the plot 1457 is above Vtrip_0 but below Vtrip_int at the sense time of t9.2. Accordingly, if the compensation data of the memory cell indicates there is no compensation, the memory cell will be considered to have completed programming. If the compensation data of the memory cell indicates there is an intermediate or maximum amount of compensation, the memory cell will be considered to have not completed programming.

FIG. 14E depicts another example of VWLn during verify operations in the verify phase of FIG. 14A, consistent with step 1308 of FIG. 13, where three verify voltages are used for each data state. As mentioned in connection with step 1308 of FIG. 13, an amount of compensation can be set for a memory cell by sensing the memory cell during one verify voltage among multiple verify voltages for an assigned data state. The one verify voltage is identified based on the compensation data. This approach has a time penalty compared to the approaches of FIGS. 14B and 14C but can avoid the need for adjustments to sensing parameters such as bit line voltage, sense time and trip voltage.

The signal 1460 includes three levels for verify tests of the A state, e.g., VvAmax, VvAint and VvA, where VvAmax<VvAint<VvA, and three levels for verify tests of the B state, e.g., VvBmax, VvBint and VvB, where VvBmax<VvBint<VvB. The time points t9-t11 in FIG. 14B-14E are the same as in FIG. 14A. FIG. 14E adds the additional time points t12-t15.

When the verify voltage is relatively high (e.g., VvA), the memory cell will reach the lockout condition relatively later in the program operation and thus be programmed to a relatively high Vth. When the verify voltage is relatively low (e.g., VvAmax), the memory cell will reach the lockout condition relatively early in the program operation and thus be programmed to a relatively low Vth. When the verify voltage is at an intermediate level (e.g., VvAint), the memory cell will reach the lockout condition at a time which is neither relatively early nor relatively late in the program operation and thus be programmed to an intermediate Vth.

In this example, the verification signal comprises multiple voltages associated with the assigned data state of the selected memory cell.

Figure 15E:
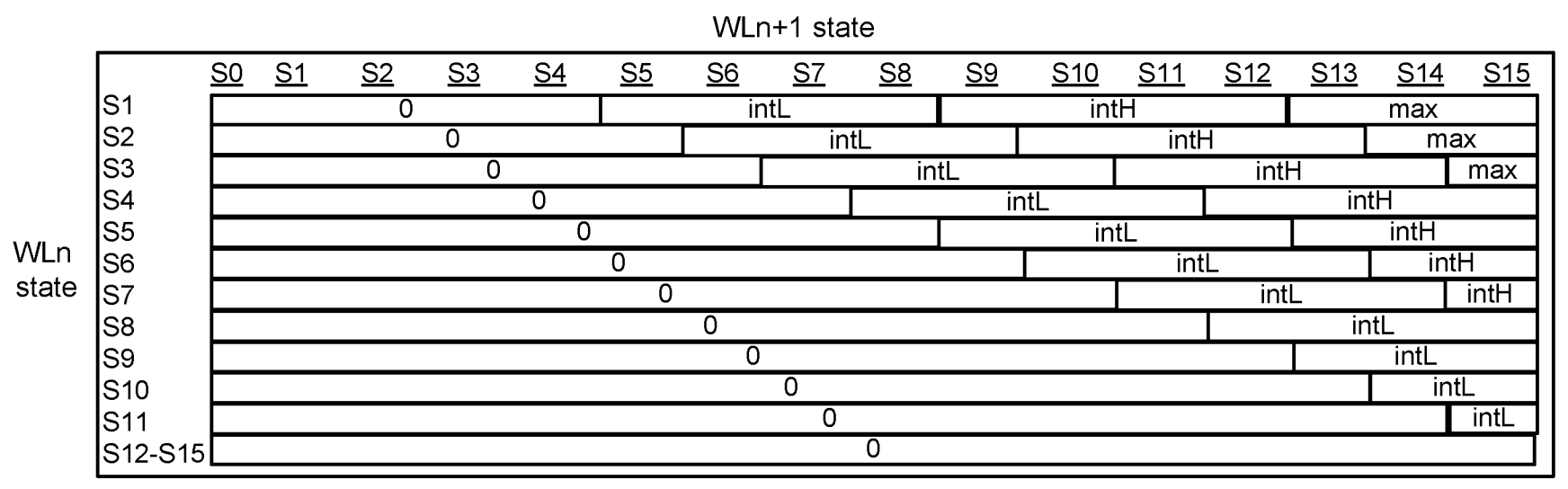

FIG. 15A depicts an example of compensation data, where eight data states and two levels of compensation are provided. In FIG. 15A-15E, the vertical axis denotes an assigned data state of a WLn memory cell, the horizontal axis denotes an assigned data state of an adjacent WLn+1 memory cell, and each row of the table denotes an amount of compensation for a given combination of data states on the adjacent WLn and WLn+1 memory cells in a NAND string. The data states of the WLn memory cell are the programmed states, e.g., the states other than the erased state.

"0" denotes no compensation and "max" denotes a maximum amount, or some amount, of compensation. This example provides a simple implementation in which a single bit of compensation data is used for each NAND string, consistent with FIG. 18A. Compensation is provided when the WLn+1 data state is four or more data states higher than the WLn data state. For example, when the WLn memory cell is assigned to the A, B or C state, compensation is provided when the WLn+1 memory cell is assigned to the E-G states, F and G states, and G state, respectively. No compensation is provided when the WLn data state is the D-G state.

FIG. 15B depicts an example of compensation data, where eight data states and three levels of compensation are provided. "0" denotes no compensation, "int" denotes an intermediate amount of compensation, and "max" denotes a maximum amount of compensation. The intermediate amount of compensation is less than the maximum compensation.

This example can be implemented using two bits of compensation data for each NAND string, consistent with FIG. 18B. No compensation is provided when the WLn+1 data state is less than three data states higher than the WLn data state. The intermediate compensation is provided when the WLn+1 data state is three-five data states higher than the WLn data state. The maximum compensation is provided when the WLn+1 data state is six data states higher than the WLn data state.

For example, when the WLn memory cell is assigned to the A state, no compensation is provided when the WLn+1 memory cell is assigned to the Er-C states, the intermediate compensation is provided when the WLn+1 memory cell is assigned to the D-F states, and the maximum compensation is provided when the WLn+1 memory cell is assigned to the G state. The maximum compensation is only available for the A state memory cells in this example.

No compensation is provided when the WLn data state is the E-G state.

FIG. 15C depicts another example of compensation data, where eight data states and three levels of compensation are provided, and where the level of compensation is a function of the assigned data state of the WLn memory cell. As mentioned, the amount of compensation and the corresponding parameter which is set in the verify test, can be a function of a number of data states by which the assigned data state of the adjacent memory cell exceeds the assigned data state of the selected memory cell. Additionally, the amount of compensation and the corresponding parameter which is set in the verify test, can be a function of the assigned data state of the selected memory cell. In this example, the amount of compensation is greater for the A and B states versus the C and D states.

No compensation is provided when the WLn+1 data state is less than two data states higher than the WLn data state, when the WLn data state is the A or B state. No compensation is provided when the WLn+1 data state is less than three data states higher than the WLn data state, when the WLn data state is the C or D state.

The intermediate compensation is provided when the WLn+1 data state is two-five data states higher than the WLn data state, when the WLn data state is the A or B state. The intermediate compensation is provided when the WLn+1 data state is three-five data states higher than the WLn data state, when the WLn data state is the C or D state. The maximum compensation is provided when the WLn+1 data state is six data states higher than the WLn data state, when the WLn data state is the A.

For example, when the WLn memory cell is assigned to the A state, no compensation is provided when the WLn+1 memory cell is assigned to the Er-B states, the intermediate compensation is provided when the WLn+1 memory cell is assigned to the C-F states, and the maximum compensation is provided when the WLn+1 memory cell is assigned to the G state. The maximum compensation is only available for the A state memory cells in this example.

No compensation is provided when the WLn data state is the E-G state.

This approach provides the intermediate compensation in more cases when the WLn memory cell is assigned to the A or B state. This can provide a greater compensation for these memory cells which may be particularly susceptible to Vth upshifts and read errors.

FIG. 15D depicts an example of compensation data, where eight data states and four levels of compensation are provided. In FIGS. 15D and 15E, "0" denotes no compensation, "intL" denotes a low-intermediate amount of compensation, "intH" denotes a high-intermediate amount of compensation, and "max" denotes a maximum amount of compensation. The high-intermediate amount of compensation is less than the maximum compensation and more than the low-intermediate amount of compensation.

This example can be implemented using two bits of compensation data for each NAND string, consistent with FIG. 18C. No compensation is provided when the WLn+1 data state is less than two data states higher than the WLn data state. The low-intermediate compensation is provided when the WLn+1 data state is two or three data states higher than the WLn data state. The high-intermediate compensation is provided when the WLn+1 data state is four or five data states higher than the WLn data state. The maximum compensation is provided when the WLn+1 data state is six data states higher than the WLn data state.

For example, when the WLn memory cell is assigned to the A state, no compensation is provided when the WLn+1 memory cell is assigned to the Er-B states, the low-intermediate compensation is provided when the WLn+1 memory cell is assigned to the C and D states, the high-intermediate compensation is provided when the WLn+1 memory cell is assigned to the E and F states, and the maximum compensation is provided when the WLn+1 memory cell is assigned to the G state. The maximum compensation is only available for the A state memory cells in this example.

No compensation is provided when the WLn data state is the F or G state.

FIG. 15E depicts an example of compensation data, where sixteen data states and four levels of compensation are provided. This example can be implemented using two bits of compensation data for each NAND string, consistent with FIG. 18C. The data states are denoted by S0-S15, where S0 is the erased state, S1-S15 are the programmed states, and S15 is the highest programmed state. No compensation is provided when the WLn+1 data state is less than four data states higher than the WLn data state. The low-intermediate compensation is provided when the WLn+1 data state is four-seven data states higher than the WLn data state. The high-intermediate compensation is provided when the WLn+1 data state is eight-eleven data states higher than the WLn data state. The maximum compensation is provided when the WLn+1 data state is twelve or more data states higher than the WLn data state.

For example, when the WLn memory cell is assigned to the Si state, no compensation is provided when the WLn+1 memory cell is assigned to the S0-S4 states, the low-intermediate compensation is provided when the WLn+1 memory cell is assigned to the S5-S8 states, the high-intermediate compensation is provided when the WLn+1 memory cell is assigned to the S9-S12 states, and the maximum compensation is provided when the WLn+1 memory cell is assigned to the S13-S15 state. The maximum compensation is available for the S1-S3 state memory cells in this example.

No compensation is provided when the WLn data state is the S12-S15 states.

In one approach, one table of compensation data such as depicted in FIG. 15A-15E can be provided for multiple blocks in a memory device. In another approach, a separate table of compensation data is provided for each block of memory cells. In another approach, multiple tables of compensation data are provided for one block of memory cells. For example, separate tables may be provided for the lower and upper halves of a block, or for separate groups of adjacent word lines. Due to the narrowing of the memory holes at the lower half of the block, the associated memory cells may experience more or less disturb compared to the memory cells at the upper half of the block. By optimizing the table of compensation data for different groups of word lines, the reductions of the disturbs can be optimized. For example, in FIG. 7, one group of word lines can include WL0-WL5 and another group of word liens can include WL6-WL10.

In another approach, separate tables of compensation data can be provided for separate sub-blocks of a block. The tables can be optimized to account for factors such as a greater thinning of the block oxide layer at the exterior sub-blocks compared to the interior sub-blocks in the fabrication process. In particular, the word line layers may be formed by etching away a sacrificial material and introducing a metal, where the etchant is introduced via the edges of the block. This etching can reduce the thickness of the block oxide layer of the memory holes in the exterior sub-blocks to a greater extent than for the interior sub-blocks, resulting in a different disturb behavior. For example, in FIG. 7, one table can be provided for the exterior sub-blocks SB0 and SB3, and another table can be provided for the interior sub-blocks SB1 and SB2.

The tables of compensation data can also account for factors such as the number of program-erase (P-E) cycles in a block. With a higher number of P-E cycles, the amount of disturb can be greater. The compensation data can therefore be adjusted to provide relatively more compensation for a given difference between the WLn+1 data state and the WLn data state.

The tables of compensation data can also account for environmental conditions of the memory device such as temperature. The compensation data can be adjusted to provide relatively more compensation for a given difference between the WLn+1 data state and the WLn data state, as a function of temperature.

Figure 16A:
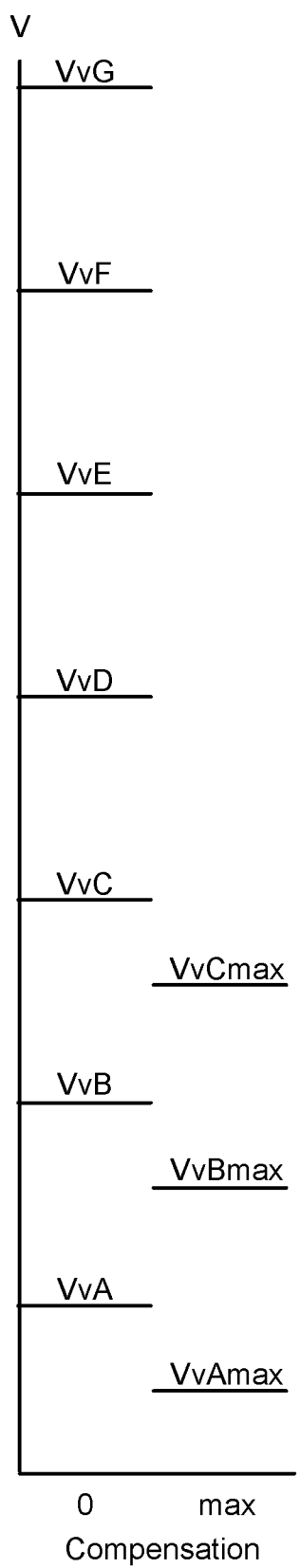
FIG. 16A depicts a plot of verify voltage versus an amount of compensation, consistent with FIG. 15A.
Figure 16B:
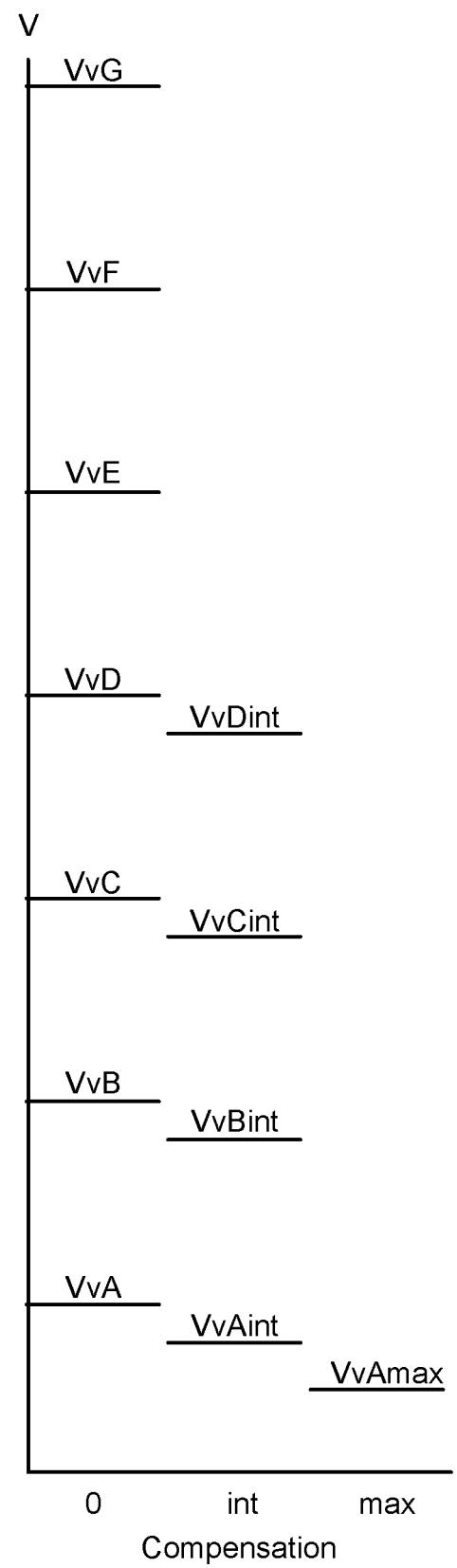
FIG. 16B depicts a plot of verify voltage versus an amount of compensation, consistent with FIG. 15B.
Figure 16C:
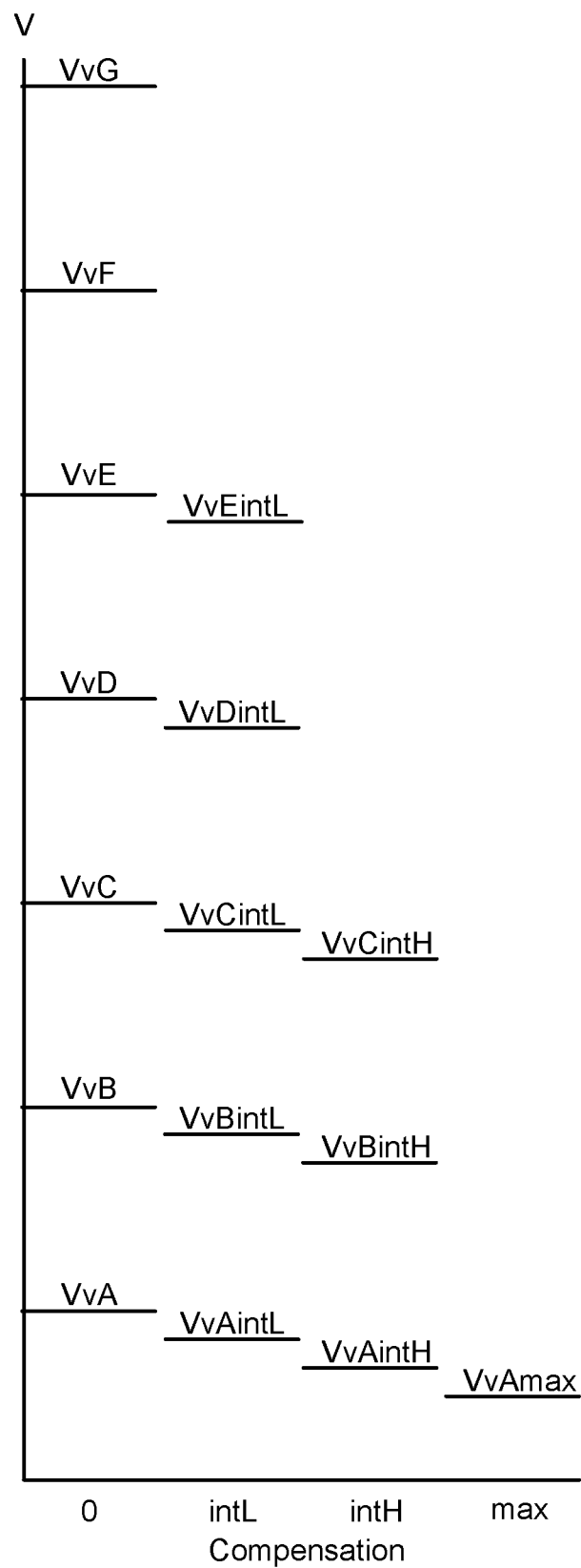
FIG. 16C depicts a plot of verify voltage versus an amount of compensation, consistent with FIG. 15D.

FIG. 16A depicts a plot of verify voltage versus an amount of compensation, consistent with FIG. 15A. In FIG. 16A-16C, the vertical axis depicts a voltage and the horizontal axis depicts an amount of compensation. The voltage indicates a level which the Vth of a WLn memory cell exceeds when it completes programming and reaches the lockout condition.

In FIG. 16A-16C, when no compensation is applied, the Vth of a WLn memory cell must exceed VvA-VvG to complete programming when it is assigned to the A-G states, respectively. In FIG. 16A, when the maximum compensation is applied, the Vth of a WLn memory cell must exceed VvAmax-VvCmax to complete programming when it is assigned to the A-C states, respectively, and the Vth of a WLn memory cell must exceed VvD-VvG to complete programming when it is assigned to the D-G states, respectively.

With the compensation data of FIG. 15A, FIG. 16A provides an example in which a sense circuit is configured to determine that a selected memory cell has completed programming when a threshold voltage of the selected memory cell exceeds a first level (e.g., VvA, VvB or VvC) and the assigned data state of the adjacent memory cell is no more than a specified number of data states (e.g., three data states) higher than the assigned data state of the selected memory cell, and the sense circuit is configured to determine that the selected memory cell has completed programming when the threshold voltage of the selected memory cell exceeds a second level (e.g., VvAmax, VvBmax, VvCmax) which is lower than the first level and the assigned data state of the adjacent memory cell is more than the specified number of data states higher than the assigned data state of the selected memory cell.

FIG. 16B depicts a plot of verify voltage versus an amount of compensation, consistent with FIG. 15B. When the intermediate compensation is applied, the Vth of a WLn memory cell must exceed VvAint-VvDint to complete programming when it is assigned to the A-D states, respectively. When the maximum compensation is applied, the Vth of a WLn memory cell must exceed VvAmax to complete programming when it is assigned to the A state.

FIG. 16C depicts a plot of verify voltage versus an amount of compensation, consistent with FIG. 15D. When the low-intermediate compensation is applied, the Vth of a WLn memory cell must exceed VvAintL-VvEintL to complete programming when it is assigned to the A-E states, respectively. When the high-intermediate compensation is applied, the Vth of a WLn memory cell must exceed VvAintH-VvCintH to complete programming when it is assigned to the A-C states, respectively. When the maximum compensation is applied, the Vth of a WLn memory cell must exceed VvAmax to complete programming when it is assigned to the A state.

FIG. 17 depicts example values in the data state latches of FIG. 2 during a program operation, where eight data states are used, consistent with step 1301 of FIG. 13. A 0 or 1 bit is depicted for each of the latches UDL, MDL and LDL. Each column indicates a different configuration or sequence of bits of the latches. The column titled Er indicates that, for memory cells which are assigned to the erased state or which are inhibited from programming, the latches have all 1's. At the start of a program operation, the UDL, MDL and LDL latches together provide a sequence of 3 bits which identify the assigned data state of a memory cell. When a memory cell completes programming and is inhibited from further programming, any UDL, MDL and LDL latches with 0 are flipped to 1. By accessing the latches, a sense block can determine in each program-verify iteration whether a memory cell is subject to programming, or is inhibited from programming.

FIG. 18A depicts example values in the compensation data latches CDL1 of FIG. 2 during a program operation, where two levels of compensation are provided, consistent with FIG. 15A. A single bit is used. For instance, when the bit=0, no compensation is provided and when the bit=1, compensation is provided. The sense circuit is configured to read the compensation data and configure itself during sensing accordingly. The configuration can involve setting the bit line voltage, word line voltage, sense node discharge period and/or trip voltage, as discussed.

The compensation data also indicates whether the assigned data state of the adjacent memory cell exceeds the assigned data state of the selected memory cell by a specified number of data states. In this example, one or more latches associated with a NAND string comprise a single bit which indicates whether the assigned data state of the adjacent memory cell is more than a first number of data states greater than the assigned data state of the selected memory cell. For example, referring to FIG. 15A, CDL1 indicates whether the assigned data state of the adjacent memory cell is more than three data states greater than the assigned data state of the selected memory cell. If CDL1=0, the assigned data state of the adjacent memory cell is not more than three data states greater than the assigned data state of the selected memory cell, so that no compensation is applied. If CDL1=1, the assigned data state of the adjacent memory cell is more than three data states greater than the assigned data state of the selected memory cell, so that compensation is applied.

FIG. 18B depicts example values in the compensation data latches CDL1 and CDL2 of FIG. 2 during a program operation, where three levels of compensation are provided, consistent with FIG. 15B. For instance, when the bit=0 in CDL1 and CDL2, no compensation is provided, when the bit=0 in CDL1 and 1 in CDL2, an intermediate amount of compensation is provided, and when the bit=1 in CDL1 and CDL2, a maximum amount of compensation is provided.

In this example, one or more latches associated with a NAND string comprise multiple bits which indicate whether the assigned data state of the adjacent memory cell exceeds the assigned data state of the selected memory cell by a first number of data states, and whether the assigned data state of the adjacent memory cell exceeds the assigned data state of the selected memory cell by a second number of data states. For example, referring to FIG. 15B, CDL1 and CDL2 together indicate whether the assigned data state of the adjacent memory cell is more than two data states greater than the assigned data state of the selected memory cell, and whether the assigned data state of the adjacent memory cell is more than five data states greater than the assigned data state of the selected memory cell.

FIG. 18C depicts example values in the compensation data latches CDL1 and CDL2 of FIG. 2 during a program operation, where four levels of compensation are provided, consistent with FIG. 15D. For instance, when the bit=0 in CDL1 and CDL2, no compensation is provided, when the bit=0 in CDL1 and 1 in CDL2, a low-intermediate amount of compensation is provided, when the bit=1 in CDL1 and 0 in CDL2, a high-intermediate amount of compensation is provided, and when the bit=1 in CDL1 and CDL2, a maximum amount of compensation is provided.

In an example implementation, the memory cells connected to a selected word line are in respective NAND strings, respective bit lines are connected to the respective NAND strings, and latches are updated to indicate a voltage to be applied to the respective bit lines during verify tests of a program operation for the memory cells connected to the selected word line. The latches may comprise at least two latches (e.g., CDL1, CDL2) associated with each bit line, and the at least two latches associated with each bit line may be updated with bits indicating a voltage in a set of at least three voltages (e.g., Vbl0, Vblint and Vblmax in FIG. 14A) to be applied to the respective bit line. The at least two latches associated with each bit line may be updated with bits indicating a bit line voltage, word line voltage, sense time or trip voltage in a set of at least three bit line voltages, word line voltages, sense times or trip voltages, respectively.

FIG. 19A depicts an example set of memory cells 1900 connected to a word line WLn selected for programming, and their assigned data states, consistent with step 1100 of FIG. 11B. This simplified example includes eight memory cells. Each memory cell is represented by a box and the assigned data state (Er-G) is represented by a letter inside the square. For example the memory cells 1901, 1902, 1903, 1904, 1905, 1906, 1907 and 1908 are assigned to the G, C, E, F, A, Er, B and D states, respectively. A memory cell which is assigned to a data state is configured to store data of the data state. The data states are typically randomly distributed among the memory cells.

The set of memory cells 1900 may represent a plurality of memory cells connected to a word line. The plurality of memory cells are configured to store data in a plurality of data states Er-G. The plurality of data states include the erased state (Er) and programmed states (e.g., A-G).

FIG. 19B depicts example pages of data which represent the assigned data states of the set of memory cells of FIG. 19A, consistent with step 1100 of FIG. 11B and with FIG. 17. The pages include a lower page (LP), a middle page (MP) and an upper page (UP). For example, for the memory cell 1901, LP=0, MP=1 and UP=1.

FIG. 19C depicts an example set of memory cells 1910 connected to a word line WLn+1, and their assigned data states, consistent with step 1111 of FIG. 11B. For example the memory cells 1911, 1912, 1913, 1914, 1915, 1916, 1917 and 1918 are assigned to the E, B, Er, D, G, C, F and A states, respectively.

FIG. 19D depicts example pages of data which represent the assigned data states of the set of memory cells of FIG. 19C, consistent with step 1111 of FIG. 11B and with FIG. 17. The pages include a lower page (LP), a middle page (MP) and an upper page (UP). For example, for the memory cell 1911, LP=0, MP=0 and UP=0.

FIG. 19E depicts example compensation data which is generated from the pages of data of FIGS. 19B and 19D, consistent with steps 1113-1115 of FIG. 11B and with FIGS. 15B and 18B. In this example, three levels of compensation can be provided: no compensation, intermediate compensation or maximum compensation. Using the information discussed in connection with FIGS. 15B and 18B, the compensation data is generated to indicate no compensation for the WLn memory cells 1901, 1902, 1903, 1904, 1906 and 1908, intermediate compensation for the WLn memory cell 1907 (since the WLn memory cell 1907 is in the B state and the adjacent WLn+1 memory cell 1917 is four states higher, in the F state), and maximum compensation for the WLn memory cell 1905 (since the WLn memory cell 1905 is in the A state and the adjacent WLn+1 memory cell 1915 is six states higher, in the G state).

The comparison circuit 133 can use any technique to compare the assigned states of the WLn and WLn+1 memory cells. For example, the assigned states can be compared in binary, decimal, hexadecimal or other format. Each assigned state can be represented by a number in which higher states are represented by a higher number. The comparison circuit can determine if the assigned state of the WLn+1 memory cell is greater than the assigned state of the WLn memory cell by subtracting the number representing the assigned state of the WLn memory cell from the number representing the assigned state of the WLn+1 memory cell and determining if the number exceeds one or more levels which trigger one or more amounts of compensation. In one example, the A-G states are assigned to the numbers 1-7, respectively. A calculation can be made that the G state is six states higher than the A state by subtracting one from seven, for instance.

In one implementation, an apparatus comprises: a NAND string comprising a selected memory cell and an adjacent memory cell of the selected memory cell, the adjacent memory cell is programmed after the selected memory cell; a programming circuit connected to the NAND string, the programming circuit configured to program the selected memory cell by applying a program voltage to the selected memory cell followed by a verification signal; and a sense circuit connected to the NAND string, the sense circuit configured to sense the selected memory cell during the verification signal and to set a parameter of the sensing as a function of a difference between an assigned data state of the selected memory cell and an assigned data state of the adjacent memory cell.

In another implementation, a method comprises: applying a program voltage to a selected word line during a program-verify iteration of a program operation, a selected memory cell in a NAND string is connected to the selected word line, an adjacent unselected memory cell in the NAND string is connected to an adjacent word line of the selected word line, and the adjacent unselected memory cell is programmed after the selected memory cell; applying a verification signal to the selected word line during the program-verify iteration; and during the applying of the verification signal, sensing whether a threshold voltage of the selected memory cell exceeds a level, the level is a function of a number of data states by which an assigned data state of the adjacent unselected memory cell exceeds an assigned data state of the selected memory cell.

In another implementation, an apparatus comprises: a first storage location for assigned data states of memory cells connected to a selected word line; a second storage location for assigned data states of memory cells connected to an adjacent word line of the selected word line; and a controller configured to access the first storage location and the second storage location, to perform a comparison of the assigned data states of the memory cells connected to the selected word line to the assigned data states of the memory cells connected to the adjacent word line, to generate compensation data based on the comparison, and to update latches associated with the memory cells connected to the selected word line with the compensation data.

The foregoing detailed description of the invention has been presented for purposes of illustration and description. It is not intended to be exhaustive or to limit the invention to the precise form disclosed. Many modifications and variations are possible in light of the above teachings. The described embodiments were chosen in order to best explain the principles of the invention and its practical application, to thereby enable others skilled in the art to best utilize the invention in various embodiments and with various modifications as are suited to the particular use contemplated. It is intended that the scope of the invention be defined by the claims appended hereto.

We claim:

1. An apparatus, comprising:
a NAND string comprising a selected memory cell and an adjacent memory cell of the selected memory cell, the adjacent memory cell is programmed after the selected memory cell;
a circuit connected to the NAND string, the circuit is configured to:
   program the selected memory cell by applying a program voltage to the selected memory cell followed by a verification signal;
   sense the selected memory cell during the verification signal and set a parameter of the sensing as a function of a difference between an assigned data state of the selected memory cell and an assigned data state of the adjacent memory cell;
   determine that the selected memory cell has completed programming when a threshold voltage of the selected memory cell exceeds a first level and the assigned data state of the adjacent memory cell is no more than a specified number of data states higher than the assigned data state of the selected memory cell; and determine that the selected memory cell has completed programming when the threshold voltage of the selected memory cell exceeds a second level which is lower than the first level and the assigned data state of the adjacent memory cell is more than the specified number of data states higher than the assigned data state of the selected memory cell.

2. The apparatus of claim 1, wherein:
the parameter is a function of the assigned data state of the selected memory cell.

3. The apparatus of claim 1, wherein:
the parameter comprises a voltage of a bit line connected to the NAND string.

4. The apparatus of claim 1, wherein:
the verification signal comprises multiple voltages associated with the assigned data state of the selected memory cell; and
the parameter comprises one of the multiple voltages.

5. The apparatus of claim 1, wherein:
the circuit comprises a sense node; and
the parameter comprises a discharge period for detecting whether a voltage of the sense node has decayed below a trip voltage.

6. The apparatus of claim 1, further comprising:
one or more latches associated with the NAND string, the one or more latches are configured to store data based on the difference, wherein the circuit is configured to set the parameter responsive to the data in the one or more latches.

7. The apparatus of claim 6, wherein:
the one or more latches associated with the NAND string comprise a single bit which indicates whether the assigned data state of the adjacent memory cell is more than a first number of data states greater than the assigned data state of the selected memory cell.

8. The apparatus of claim 6, wherein:
the one or more latches associated with the NAND string comprise multiple bits which indicate whether the assigned data state of the adjacent memory cell exceeds the assigned data state of the selected memory cell by a first number of data states, and whether the assigned data state of the adjacent memory cell exceeds the assigned data state of the selected memory cell by a second number of data states.

9. The apparatus of claim 6, further comprising:
a controller configured to update the one or more latches based on a comparison of the assigned data state of the selected memory cell to the assigned data state of the adjacent memory cell.

10. A method, comprising:
applying a program voltage to a selected word line during a program-verify iteration of a program operation, a selected memory cell in a NAND string is connected to the selected word line, an adjacent unselected memory cell in the NAND string is connected to an adjacent word line of the selected word line, and the adjacent unselected memory cell is programmed after the selected memory cell;
applying a verification signal to the selected word line during the program-verify iteration; and
during the applying of the verification signal, sensing whether a threshold voltage of the selected memory cell exceeds a level, the level is a function of a number of data states by which an assigned data state of the adjacent unselected memory cell exceeds an assigned data state of the selected memory cell, the sensing comprises adjusting a voltage of a bit line connected to the NAND string, the voltage is higher when the assigned data state of the adjacent unselected memory cell is no more than a specified number of data states higher than the assigned data state of the selected memory cell, than when the assigned data state of the adjacent unselected memory cell is more than the specified number of data states higher than the assigned data state of the selected memory cell.

11. The method of claim 10, wherein:
the level is a first level when the assigned data state of the adjacent unselected memory cell is no more than a specified number of data states higher than the assigned data state of the selected memory cell; and
the level is a second level which is lower than the first level when the assigned data state of the adjacent unselected memory cell is more than the specified number of data states higher than the assigned data state of the selected memory cell.

12. The method of claim 10, wherein:
the sensing comprises reading one or more latches associated with the NAND string to determine the number of data states by which the assigned data state of the adjacent unselected memory cell exceeds the assigned data state of the selected memory cell, and adjusting a parameter of the sensing based on the number of data states by which the assigned data state of the adjacent unselected memory cell exceeds the assigned data state of the selected memory cell.

13. The method of claim 12, further comprising:
comparing the assigned data state of the selected memory cell to the assigned data state of the adjacent unselected memory cell; and
storing data in the one or more latches which indicate the number of data states by which the assigned data state of the adjacent unselected memory cell exceeds the assigned data state of the selected memory cell based on the comparing.

14. An apparatus, comprising:
memory cells in respective NAND strings connected to a selected word line;
latches associated with the memory cells connected to the selected word line;
respective bit lines connected to the respective NAND strings;
a first storage location for assigned data states of the memory cells connected to the selected word line;
a second storage location for assigned data states of memory cells connected to an adjacent word line of the selected word line; and
a controller configured to access the first storage location and the second storage location, to perform a comparison of the assigned data states of the memory cells connected to the selected word line to the assigned data states of the memory cells connected to the adjacent word line, to generate compensation data based on the comparison, and to update latches associated with the memory cells connected to the selected word line with the compensation data, the latches are updated to indicate a voltage to be applied to the respective bit lines during verify tests of a program operation for the memory cells connected to the selected word line.

15. The apparatus of claim 14, wherein:
the controller is configured to delay programming of the memory cells connected to the selected word line until after the comparison is performed.

16. The apparatus of claim 14, wherein:
the memory cells are on a chip; and the controller is off the chip; and the first storage location and the second storage location are in random access memory of the controller.

17. The apparatus of claim 16, wherein:

the latches comprise at least two latches associated with each bit line; and the at least two latches associated with each bit line are updated with bits indicating a voltage in a set of at least three voltages to be applied to the respective bit lines.

18. The apparatus of claim 14, wherein:

the controller is configured to program the memory cells connected to the adjacent word line after programming the memory cells connected to the selected word line.

* * * * *